United States Patent [19]
Yuuki et al.

[11] Patent Number: 6,096,133
[45] Date of Patent: Aug. 1, 2000

[54] CHEMICAL VAPOR DEPOSITION APPARATUS

[75] Inventors: Akimasa Yuuki; Takaaki Kawahara; Tetsuro Makita; Mikio Yamamuka; Koichi Ono; Tomonori Okudaira, all of Tokyo, Japan

[73] Assignee: Mitsubishi Denki Kabushiki Kaisha, Tokyo, Japan

[21] Appl. No.: 09/478,362

[22] Filed: Jan. 6, 2000

Related U.S. Application Data

[62] Division of application No. 09/070,009, Apr. 30, 1998, Pat. No. 6,033,732, which is a division of application No. 08/579,495, Dec. 27, 1995, Pat. No. 5,776,254.

[30] Foreign Application Priority Data

Dec. 28, 1994 [JP] Japan ................................ P06-326971
Dec. 28, 1994 [JP] Japan ................................ P06-326972

[51] Int. Cl.$^7$ ................................................ C23C 16/00
[52] U.S. Cl. ........................ 118/712; 118/708; 118/724; 118/726
[58] Field of Search .................. 118/708, 712, 118/724, 726

[56] References Cited

U.S. PATENT DOCUMENTS

| | | | |
|---|---|---|---|
| 5,204,314 | 4/1993 | Kirlin et al. ................................ | 505/1 |
| 5,372,850 | 12/1994 | Uchikawa et al. .................... | 427/255.3 |
| 5,555,154 | 9/1996 | Uchikawa et al. ...................... | 361/322 |
| 5,573,979 | 11/1996 | Tsu et al. ................................ | 437/195 |

OTHER PUBLICATIONS

Kawahara et al., "Step Coverage and Electrical Properties Of (Ba, Sr) TiO$_3$ Films Prepared by Liquid Source Chemical Vapor Deposition Using TiO(DPM)$_2$", Japanese Journal of Applied Physics, vol. 33, Part 1, No. 9B, 1994, pp. 5129–5134.

Kawahara et al., "Influence Of Ti Sources On Properties Of *Ba, Sr)TiO$_3$ Films Prepared by Liquid Source CVD", Materials Research Society Symposium, vol. 361, 1995, pp. 361–368.

*Primary Examiner*—Richard Bueker
*Attorney, Agent, or Firm*—Leydig, Voit & Mayer

[57] ABSTRACT

An apparatus for depositing a thin film on a substrate by chemical vapor deposition (CVD) includes a material container for containing a liquid CVD source material; a material feeder for feeding the liquid CVD source material from the material container to a vaporizer while keeping the CVD source material liquid; a vaporizer for vaporizing the liquid CVD source material fed from the material feeder by heating the liquid CVD source material to a high temperature to form a CVD source material gas; a reaction chamber connected to the vaporizer by a pipe for forming a thin film on a substrate using the CVD source material gas; and a thermostatic box surrounding the reaction chamber, wherein both of the vaporizer and piping connecting the vaporizer to the reaction chamber are located within the thermostatic box.

3 Claims, 12 Drawing Sheets

CHEMICAL VAPOR DEPOSITION APPARATUS

This disclosure is a divisional of patent application Ser. No. 09/070,009, filed on Apr. 30, 1998, now U.S. Pat. No. 6,033,732 which is a division of prior patent application Ser. No. 08/579,495, filed on Dec. 27, 1995, now U.S. Pat. No. 5,776,254.

FIELD OF THE INVENTION

The present invention relates to an apparatus for and a method of depositing a various kinds of thin films on a substrate by means of CVD (Chemical Vapor Deposition), and more particularly to a technique for improving the performance of a vaporizer and a reaction chamber, each of which is included in the apparatus.

DESCRIPTION OF THE PRIOR ART

Recently, the degree of integration of a semiconductor memory or a semiconductor device has been rapidly progressing. For example, in a dynamic random access memory (hereinafter, the memory will be referred to "DRAM"), the degree of integration has been developed at such a rapid pace that number of bits of the DRAM has increased fourfold in the three years. The development achieves such objects increasing processing speed of the device, reducing power consumption of the device and reducing the device cost. However, no matter how highly the degree of integration is developed, a capacitor, which is a component of the DRAM, must have a certain capacitance. In consequence, it is necessary to make a film of a capacitor material thinner, but there is a limitation when $SiO_2$ or $Si_3N_4$, which is conventionally used as a capacitor material, is used. However, when a suitable capacitor material having high dielectric constant is used instead of $SiO_2$ or $Si_3N_4$, it is possible to increase the capacitance without changing the film thickness. Therefore, recently, research of utilizing a capacitor material having high dielectric constant for the memory device is given attention.

In characteristics required for the kind of capacitor material, the most important ones are high dielectric constant and small leakage current even if it is thin. In other words, it is necessary to use a capacitor material having high dielectric constant, as well as to set the film thickness as thin as possible and to minimize the leakage current. In general, a rough objective of the development may be considered that the film thickness is less than or equal to 0.6 nm in $SiO_2$ equivalent thickness and the leakage current density for application of 1.1 V voltage is less than or equal to the order of $10^{-8}$ $A/cm^2$. Further, when the thin film is formed on an electrode for a capacitor of a DRAM having step-shape portions therein, it is very advantageous that the thin film is formed by CVD which has a good step coverage property to a complicated topography. From this point of view, there has been examined such a procedure of forming the thin film by means of various film forming techniques using tantalum oxide, lead zirconate titanate (PZT), lead lanthanum zirconate titanate (PLZT), strontium titanate or barium titanate. However, though the formation of the thin film by CVD is the most advantageous, there is such a problem that there exists no CVD material which has a stable and good vaporization property at the present time. There is a problem because the vaporization property of dipivaloylmethanato (DPM) compound of β-diketone group, which is widely used as a main CVD source material, by heating is not good. Thus, according to the above-mentioned difficulty due to the material property, the present indication of affairs shows that, a technique for producing a dielectric thin film which has a good performance and good repeatability is not established yet.

In such a situation, some members in the inventors of the present invention formerly proposed a CVD material having a extremely high vaporization property which comprises a solution in which a conventionally used solid material is dissolved in an organic solvent such as tetrahydrofuran (THF), in the specification of the Japanese patent application No. 4-252836. However, the inventors of the present invention attempted to produce a dielectric thin film using the above-mentioned CVD material by means of a conventional thin film depositing apparatus (for liquid material) for producing a $SiO_2$ film etc. by CVD, and then found that there were various problems in the apparatus and the process for producing the thin film.

Hereinafter, there will be described a conventional thin film depositing apparatus or method for forming a barium strontium titanate (BST) thin film for capacitor use by CVD method using the above-mentioned CVD source material. Hereupon, as the CVD source material of Ba or Sr group, a solution in which a compound of Ba or Sr with dipivaloylmethanato (DPM), which is an organometallic complex, is dissolved in tetrahydrofuran (THF) at concentration of 0.01 to 1 mol/liter is used. Further, as the CVD source material of Ti group, titanium tetraisopropoxide (TTIP) is used.

FIG. 12 is a schematic view illustrating a rough structure of a conventionally known thin film depositing apparatus using liquid source materials.

As shown in FIG. 12, the thin film depositing apparatus (CVD apparatus) comprises a carrier gas supply tube 1 for supplying a carrier gas such as argon, a carrier gas flow controller 2 such as a mass flow controller etc. and a connecting tube 3 whose downward end is connected to a vaporizer 4. Further, the thin film depositing apparatus includes a plurality of liquid material containers 5 each of which contains a liquid CVD source material, a plurality of liquid material feeders 6 (liquid material flow controllers) such as measuring pumps etc., a plurality of material pressure tubes 21 for feeding the liquid CVD source materials by pressure and a nozzle 7 for atomizing the liquid CVD materials. Hereupon, each of the liquid material containers 5 is made of SUS 314 which has high corrosion resistance property. Still further, the thin film depositing apparatus has a heater 8 for heating the vaporizer 4, the heater 8 being designed to heat the vaporizer 4 and to hold the temperature of the vaporizer 4 at a predetermined constant value in accordance with an output of a temperature detecting sensor (not shown). Hereupon, in order to make uniform temperature distribution within the wall of the vaporizer 4, the wall of the vaporizer 4 is made of metal having high thermal conductivity such as aluminum etc. Then, the nozzle 7 is disposed in such a manner that the downward end of the nozzle 7 is located in a throttle portion 9 of the connecting tube 3 in which the flow rate of the carrier gas is maximum, and also the downward end of the nozzle 7 is cut diagonally so as to atomize the supplied CVD source material efficiently.

Moreover, the thin film depositing apparatus comprises a material gas transport piping 10, a heater 11 for keeping warm the material gas transport piping 10, a material gas supply hole 12 and a reactive gas supply tube 13. Hereupon, the reactive gas supply tube 13 supplies an oxidant. Further, the apparatus includes a heater 14 for a reaction chamber 15, the heater 14 being designed to heat the wall of the reaction chamber 15 so as to prevent recondensation of the CVD source material or powder adhesion. The apparatus also has a substrate heating equipment 16 (heating stage) for heating a substrate 17 made of silicon etc., on which a thin film is to be formed. Moreover, the apparatus includes a load-unload chamber 19 connected to the reaction chamber 15 through a gate 20 (gate valve) and a handler 18 (substrate handler) for moving the substrate 17 between the reaction chamber 15 and the load-unload chamber 19.

A procedure of depositing the thin film by CVD using the above-mentioned CVD materials and the thin film depositing apparatus is as follows (CVD process). Namely, at first, each of the vaporizer 4, material gas transport piping 10 and the reaction chamber 15 is heated by the corresponding heater(s) 8,11,14 or 16 so as to reach a predetermined temperature, respectively, and then the substrate 17 is transferred from the load-unload chamber 19 onto the substrate heating equipment 16 through the gate 20 by the handler 18. Then, when the substrate 17 is heated so as to reach a predetermined temperature, a carrier gas bomb (not shown) is opened so that carrier gas for dilution is introduced into the vaporizer 4 through the carrier gas supply tube 1, the carrier gas flow controller 2 and the throttle portion 9 of the connecting tube 3.

Then, each of a solution in which bis (dipivaloylmethanato) barium is dissolved in THF, a solution in which bis (dipivaloylmethanato) strontium is dissolved in THF and a solution in which titanyl bis (dipivaloylmethanato) is dissolved in THF is fed as a liquid CVD source material for forming a BST film at constant flow rate from a corresponding one of the liquid material containers 5 to the vaporizer side. Hereupon, each of the CVD materials is roughly atomized at the end portion of the nozzle 7 by the surrounding carrier gas flowing at high speed, and then the atomized CVD material particles collide over a wide range of the inner wall of the vaporizer 4 so as to be vaporized in a moment. At the time, since the carrier gas flows at high speed around the surface of each of the liquid particles which is vaporizing, the vaporization and mixing of the CVD material is improved (scavenging effect). Further, mixing between the CVD material is gas which is vaporized in the material gas transport piping 10 and the carrier gas is improved further so that the BST film is formed (deposited) on the surface of the substrate 17 by the gas mixture introduced into the reaction chamber 15 through the material gas supply hole 12 according to the CVD 20 reaction.

At the time, by precisely observing the surface of the substrate 17, it may be found that the BST film is deposited on the upper and side surfaces of a storage node and on the surface of an interlayer insulating film. Then, after passing of a predetermined time, the supply of each of the CVD source materials is stopped, and then the substrate 17 is transferred to the load-unload chamber 19 by the handler 18 again so that the present thin film forming process is completed.

Moreover, when a strontium titanate (SrTiO$_3$) thin film is formed by using a solution of Sr(DPM)$_2$ in THF and a solution of TiO(DPM)$_2$ in THF or TTIP as CVD materials and also using O$_2$ as an oxidant, the thin film is also formed by using the thin film depositing apparatus shown in FIG. 12. Hereupon, it is probable that TTIP, which is liquid at normal temperature and has high vapor pressure, is fed by bubbling.

In this case, after the vaporizer 4 has been heated by the heater 8 so as to reach a predetermined temperature as much as 250° C., inert carrier gas for dilution whose flow rate is controlled at a constant value by the carrier gas flow controller 2, is ejected into the vaporizer 4 through the vicinity of the nozzle 7. Then, each of the solution of Sr(DPM)$_2$ in THF and the solution of TiO(DPM)$_2$ in THF, each of which is a liquid CVD source material, is fed to the vaporizer at a constant flow rate. Hereupon, each of the CVD source materials is roughly atomized at the end portion of the nozzle 7 by the surrounding carrier gas flowing at high speed, and then the atomized CVD material particles collide with a wide range of the inner wall of the vaporizer 4 so as to be vaporized in a moment. Each of the CVD materials, which has been vaporized, is transferred to the reaction chamber 15 through the material gas transport piping 10, and then mixed with an oxidant gas (for example, O$_2$N$_2$O). The gas mixture is introduced into the reaction chamber 15 maintained at constant pressure so that the SrTiO$_3$ film is formed on the surface of the substrate 17 heated by the substrate heating equipment 16 according to the CVD reaction. When the SrTiO$_3$ film is formed using TTIP instead of TiO(DPM)$_2$, the TTIP vaporized by bubbling is fed through the reactive gas supply tube 13. Hereupon, the remainder of the gas mixture which does not contribute to the thin film formation is discharged through an exhaust line by a vacuum pump.

However, in the above-mentioned conventional thin film depositing techniques, there are such problems as follows.

(1) In the case of forming the thin film by means of the above-mentioned thin film depositing system using CVD, since the mutual ratio among Ba, Sr and Ti at the early stage of the film forming step is determined by the vaporization property of each of the CVD source materials, it is impossible to precisely control the content of each of Ba, Sr and Ti at the early stage of the film forming step, the content being an important factor for improving the crystallinity of the thin film, which controls the electrical properies of the BST film.

(2) In the case of forming the thin film by means of the above-mentioned thin film depositing system using CVD, the quality of the BST crystal at the early stage of the film forming step controls the electrical properties of the whole BST film. Then, when there is a heat treatment which is available for improving the crystallinity, it takes a relatively long time for raising its temperature, and then the throughput is reduced.

(3) The CVD process has a substrate selectivity due to decomposition of the materials. Then, from a microscopic view, it is observed that an abnormal morphology is caused on the surface of the interlayer insulating film. Further, since it is probable that the content of each of Ba, Sr and Ti in the BST film formed on the side wall of the storage node near the surface of the interlayer insulating film on the substrate is out of order, the electrical properties of the thin film may be inferior.

(4) On the storage node, it is required that the film have a high dielectric constant and low leakage current density in order to act as a capacitor insulating film, while on the surface of the interlayer insulating film, it is required that the film has a low dielectric constant in order to elevate its independence between adjacent storage nodes. Then, when the BST film is somewhat thick, the BST film on the surface of the interlayer insulating film is also crystallized so that the dielectric constant is increased.

(5) In order to give the SrTiO$_3$ film any desired electrical properties, there is required an extremely exact content control with an error within ±0.3% in the ratio of (number of Sr atoms)/(number of Ti atoms). However, since the supply flow rate (quantity of supply per unit time) of each of the liquid CVD source materials is very small, it is difficult to exactly control such a very small flow rate by means of the liquid material feeder. Further, since the responsible of the liquid material feeder is bad, there occurs an over-shoot of flow rate when the valve is opened at the start of the film forming step so that the quantity of the material gas formed by vaporization increases in response to the over-shoot. In consequence, it is difficult to form a thin film having constant composition with a good accuracy.

(6) In order to improve vaporization efficiency of $Sr(DPM)_2$, the space in the vaporizer is held at high temperature (for example, about 250° C.) and low pressure (for example, about 30 Torr). Then, the inner space of each of the nozzle and the piping connected to the nozzle is also under the state of low pressure since each of the inner spaces communicates with the vaporizer. Further, it is impossible to independently control the pressure of each of the inner spaces since the pressure changes in response to the pressure in the vaporizer. In such a condition, a solvent having high vapor pressure (for example, THF) tends to vaporize very easily, while $Sr(DPM)_2$ having low vapor pressure tends to remain in a liquid state. Thus, material concentration of the liquid in the pipes so that the viscosity of the liquid increases. In consequence, the flow rate of each of the CVD source materials is reduced, and then it is probable that a choke is caused in the piping.

(7) When each of the CVD source materials is fed from corresponding one of the liquid material containers to the vaporizer respectively, each of the CVD materials is not fed uniformly so that the thickness of the thin film can not be uniform.

(8) It is identified that in a case of forming the thin film of $SrTiO_3$, the quality of the thin film is more influenced by the kind of Ti material than the kind of Sr material. Namely, when TTIP, whose sticking probability β to the substrate is large (β–0.5 at the substrate temperature Ts=420° C. and the reactor pressure P=1.5 Torr), is used, a thin film of $SrTiO_3$ having plane and uniform structure is formed regardless of the quality of the substrate (under layer). However, when the thin film is formed on the substrate for a super LSI having a three-dimensional structure with a height as much as submicron to 1 micron, if the film forming temperature is raised above or equal to 400° C. which is a temperature required for crystallization, a film forming reaction progresses at the upper surface of the stepshape portion to which the CVD material comes first so that the CVD material is consumed. In consequence, the thin film thickness at the side of the step-shape portion becomes thinner. Namely, there occurs such a fault that the covering property of the thin film (step coverage) is reduced. In opposition, when $TiO(DPM)_2$, whose β is small (β–0.1 at Ts=420° C. and P=1.5 Torr), is used, the covering property of the thin film is good. However, there occurs such a fault that the deposition property, particularly the deposition property on the under-layer of silicon oxide, is reduced according to the material species of the under-layer. The fault becomes remarkable when the film forming temperature is low. Namely, when the temperature is lower than or equal to 450° C., the density (probability) of generation of initial cores by CVD reaction is low so that the thin film does not grow uniformly on the substrate. In consequence, there is formed such a thin film in that the size of each of particles is diverse or the grain boundary of each of the particles is not clear, and also the structure of the film is not uniform.

(9) In order to supply the CVD source material gas formed by vaporization in the vaporizer whose temperature is maintained at 250° C. to the reaction chamber without causing condensation or decomposition of the gas, it is necessary to uniformly hold the temperature of the material gas transport piping between the vaporizer and the reaction chamber at 250° C. Therefore, the material gas transport piping which comprises a tube of SUS and a valve is heated so as to be held at 250° C. by the heater (ribbon heater). However, since the heat loss from the heater to the atmosphere is significant, the heat efficiency of the heater is bad or heat uniformity at each portion of the piping is bad.

(10) In forming of the BST thin film by CVD using liquid CVD source materials, it is difficult to accomplish good repeatability of composition and film quality due to deterioration of the materials, because an adequate monitor system which can watch the process in situ does not exist.

(11) The susceptor for supporting the substrate in the reaction chamber is conventionally made of carbon. Hereupon, when formation of the thin film on the substrate is repeated about sixty times, the susceptor is deteriorated due to oxidation of carbon so that the temperature distribution within the substrate becomes nonuniform. Further, as the formation of the thin film is repeated, the temperature of the substrate changes.

(12) The temperature of the gas nozzle is determined according to the amount of heat radiated from the heating stage and the amount of heat discharged into cooling water flowing above a gas head. However, it is impossible to control the radiated or discharged heat freely.

(13) The CVD material gas formed by vaporization in the vaporizer is mixed with reactive gas, further passes through the gas nozzle, and then reacts on the substrate so as to form the thin film. Hereupon, a part of the product produced by the reaction, which has not contributed to the film formation, adheres to the inner wall of the reaction chamber so that it is probable that particles adheres to the substrate.

(14) Since temperature of the bottom side of the reaction chamber is comparatively low, a part of the product produced by the reaction, which has not contributed to the film formation, tends to condense so as to adhere on the bottom side. Thus, when the reaction chamber is evacuated by a vacuum pump or restored to atmospheric pressure, the particles deposited on the bottom side are blown up so that it is probable that the particles adhere to the substrate.

(15) Since the composition of the CVD material gas, which is formed by vaporization in the vaporizer so as to be introduced into the reaction chamber, is unstable, the composition of the thin film formed on the substrate is also unstable.

(16) Since the liquid CVD source material collides with the inner wall of the vaporizer so as to vaporize, the residue produced from the material adheres on the inner wall of the vaporizer so that the adhesive residue which is scattered in the vaporizer is introduced into the reaction chamber together with the material gas.

(17) When the inner wall of the vaporizer is contaminated due to adhesion of the residue produced from the material, it is troublesome to clean the inner wall of the vaporizer.

SUMMARY OF THE INVENTION

The present invention has been developed to solve the above-mentioned conventional problems, and has an object of providing a technique for forming a BST thin film having adequate composition and crystallinity as a capacitor insulating film for a DRAM.

Further, the present invention has been developed to eleminate faults which are caused when film formation is performed by means of the above-mentioned conventional apparatus for depositing a thin film using CVD, in particular, when an organometallic compound is used as a source material. The invention has a further object of providing a technique for forming a CVD thin film, wherein a choking of piping due to solid deposition in the pipe for supplying a liquid CVD source material can be prevented, controllability for supplying the liquid. CVD source material which is fed to a vaporizer can be improved, repeatability and controllability of elemental composition within the thin film and film forming rate can be improved, and also the CVD thin film has uniform film quality and a good covering property for a step-shape portion.

Moreover, the present invention has been developed to solve the above-mentioned problems in a conventional CVD apparatus using a liquid source material, particularly using an organometallic compound as a material, and has a further object of providing a technique for forming a thin film, wherein vaporized CVD material can be stably fed into a reaction chamber during the steps of vaporizing the liquid CVD source material and forming the thin film, formation of dust due to condensation of product of the reaction can be prevented, and also the thin film on the substrate has a good quality and accuracy without composition irregularity.

Thus, according to a first aspect of the present invention, which is developed to achieve the above-mentioned objects, there is provided an apparatus for depositing a thin film on a substrate by CVD process, which comprises, at least one material container for containing a liquid CVD material, at least one material feeder for feeding the liquid CVD material in the container to a vaporizer while keeping the CVD material in liquid state, the vaporizer vaporizing the liquid CVD material fed from the feeder by heating the material to a high temperature so as to form a CVD material gas, a reaction chamber for forming the thin film on the substrate using the CVD material gas, and a thermostatic box disposed above the reaction chamber, wherein both of the vaporizer and a piping between the vaporizer and the reaction chamber are accommodated in the thermostatic box.

In the above-mentioned apparatus, since all of the vaporizer and the piping between the vaporizer and the reaction chamber are accommodated in the thermostatic box above the reaction chamber, the system is simplified and also the heat efficiency of the system is improved so that the manufacturing cost of the device is reduced.

Further, according to a second aspect of the present invention, the apparatus may comprise a window of KBr which is provided in the reaction chamber, wherein $N_2$ gas of a high temperature is blown against an inner surface of the window, and film quality analyzer for analyzing quality of the thin film using infrared absorption spectroscopy (FT-IR) by applying infrared ray from outside of the reaction chamber to the thin film on way of film forming process in the reaction chamber through the window of KBr during deposition of the thin film.

In the above-mentioned apparatus, fundamentally, the same operations and effects as those of the apparatus according to the first aspect are achieved. Further, since the quality of the thin film on the way of film forming process is analyzed in situ by infrared absorption spectroscopy (FT-IR), the quality of the thin film can be monitored so that the quality of the thin film can be preferably controlled during the film forming step. In consequence, the quality of the thin film is improved.

Furthermore, according to a third aspect of the present invention, the apparatus may comprise a window of Be which is provided in the reaction chamber, wherein $N_2$ gas of a high temperature is blown against an inner surface of the window, and film quality analyzer for analyzing quality of the thin film using X-ray fluorescence analysis (XRF) by applying X-ray from outside of the reaction chamber to the thin film on way of film forming process in the reaction chamber through the window of Be while continuing to form the thin film.

In the above-mentioned apparatus, fundamentally, the same operations and effects as those of the apparatus according to the first aspect are achieved. Further, since the quality of the thin film on the way of film forming process is analyzed in situ by X-ray fluorescence analysis (XRF), the quality of the thin film can be monitored so that the quality of the thin film can be preferably controlled during the film forming step. In consequence, the quality of the thin film is improved.

Moreover, according to a fourth aspect of the present invention, there is provided an apparatus for depositing a thin film on a substrate by CVD process, which comprises, at least one material container for containing a liquid CVD material which includes a solution in which at least one organometallic complex is dissolved in a solvent, at least one material feeder for feeding the liquid CVD material in the container at a constant flow rate, a vaporizer for vaporizing the liquid CVD material fed from the feeder by heating so as to form a CVD material gas, a reaction chamber for forming the thin film on the substrate using the CVD material gas, a constant flow feeder for feeding an inert gas, into which a solvent has been mixed previously, to the vaporizer with a constant flow rate, and a flow joiner for joining the liquid CVD material, which is fed from the feeder to the vaporizer, to the inert gas constant flow.

In the above-mentioned apparatus, the inert gas, into which the solvent has been mixed previously, is fed to the vaporizer at the constant flow rate, and then the CVD material solution fed from the material feeder is joined to the inert gas flow. In consequence, the CVD material does not stagnate at any local position in the piping so that a choke of the piping is not caused.

In addition, according to a fifth aspect of the present invention there is provided an apparatus for depositing a thin film on a substrate by CVD process, which comprises, at least one material container for containing a liquid CVD material, at least one material feeder for feeding the liquid CVD material in the container to a vaporizer while keeping the CVD material in liquid state, the vaporizer vaporizing the liquid CVD material fed from the feeder by heating the material to a high temperature so as to form a CVD material gas, and a reaction chamber for forming the thin film on the substrate using the CVD material gas, wherein the reaction chamber performs thin film forming treatment while moving the substrate under a plurality of gas heads and a plurality of lamp heaters for heating the substrate so as to form the thin film, each of the gas heads being arranged in a line and able to control its material ejecting rate independently, and also each of the lamp heaters being arranged in a line.

In the above-mentioned apparatus, since the thin film is formed under the most suitable thermal circumstance in each of the early, middle and final stages of the film forming step, the electrical characteristics of the thin film may be highly improved.

Further, according to a sixth aspect of the present invention, there is provided an apparatus for depositing a thin film on a substrate by CVD process, which comprises, at least one material container for containing a liquid CVD material, at least one material feeder for feeding the liquid CVD material in the container to a vaporizer while keeping the CVD material in liquid state, the vaporizer vaporizing the liquid CVD material fed from the feeder by heating the material to a high temperature so as to form a CVD material gas, and a reaction chamber for forming the thin film on the substrate using the CVD material gas, wherein the container contains a liquid CVD material of 100 to 3000 cc including a solution in which TiO(DPM)$_2$, Ba(DPM)$_2$, Sr(DPM)$_2$ or TTIP is dissolved in tetrahydrofuran (THF) at a concentration of 0.01 to 1.0 mol/liter, and the reaction chamber performs thin film forming treatment while moving the substrate under a plurality of gas heads and a plurality of lamp heaters for heating the substrate so as to form the thin film of barium strontium titanate (BST), each of the gas heads being arranged in a line and able to control its material ejecting rate independently, and also each of the lamp heaters being arranged in a line.

In the above-mentioned apparatus, since the thin film is formed with the most suitable materials and component thereof and also under the most suitable thermal circumstance in each of the early, middle and final stages of the film forming step, the formation of the BST thin film with good electrical characteristics is achieved with efficient through put.

Furthermore, according to a seventh aspect of the present invention, there is provided an apparatus for depositing a thin film on a substrate by CVD process, which comprises, at least one material container for containing a liquid CVD material in which an organometallic complex is dissolved in a solvent, at least one material feeder for feeding the liquid CVD material at a constant flow rate, a vaporizer for vaporizing the liquid CVD material fed from the feeder by heating so as to form a CVD material gas, and a reaction chamber for forming the thin film on the substrate using the CVD material gas, wherein the vaporizer is formed in such a manner that it has a cylindrical shape and the liquid CVD material is introduced into the vaporizer in a tangential direction of the vaporizer.

In the above-mentioned apparatus, the vaporizer has the cylindrical shape and further the liquid CVD material is introduced into the vaporizer together with the carrier gas in the tangential direction (circumferential direction) of the vaporizer. Therefore, when the CVD material gas formed in the vaporizer is discharged in the direction of the central axis of the vaporizer, dust making substance such as residue formed due to vaporization of the liquid CVD material adheres to the inner wall of the vaporizer so that the coming of the dust making substance into the reaction chamber is prevented.

Moreover, according to a eighth aspect of the present invention, there is provided an apparatus for depositing a thin film on a substrate by CVD process, which comprises, at least one material container for containing a liquid CVD material in which an organometallic complex is dissolved in a solvent, at least one material feeder for feeding the liquid CVD material at a constant flow rate, a vaporizer for vaporizing the liquid CVD material fed from the feeder by heating so as to form a CVD material gas, a reaction chamber for forming the thin film on the substrate using the CVD material gas, and an atomizer for atomizing the liquid CVD material which is to be fed into the vaporizer.

In the above-mentioned apparatus, since the liquid CVD material is atomized by the atomizer before entering the vaporizer, the liquid CVD material becomes a lot of uniform fine particles before entering the vaporizer. In consequence, the amount of residue produced from the CVD material in the vaporizer (inner wall) is reduced.

In addition, according to a ninth aspect of the present invention, there is provided an apparatus for depositing a thin film on a substrate by CVD process, which comprises, at least one material container for containing a liquid CVD material in which an organometallic complex is dissolved in a solvent, at least one material feeder for feeding the liquid CVD material at a constant flow rate, a vaporizer for vaporizing the liquid CVD material fed from the feeder by heating so as to form a CVD material gas, and a reaction chamber for forming the thin film on the substrate using the CVD material gas, wherein the vaporizer has a replaceable inner wall.

In the above-mentioned apparatus, since the inner wall of the vaporizer is replaceable, adhesive on the inner wall can be removed by replacing the inner wall after the conclusion of the film forming step. Therefore, the work for removing the adhesive is simplified.

Further, according to a tenth aspect of the present invention, there is provided an apparatus for depositing a thin film on a substrate by CVD process, which comprises, at least one material container for containing a liquid CVD material which includes a solution in which an organometallic complex is dissolved in a solvent, at least one material feeder for feeding the liquid CVD material in the container at a constant flow rate, a vaporizer for vaporizing the liquid CVD material fed from the feeder by heating so as to form a CVD material gas, a reaction chamber for forming the thin film on the substrate using the CVD material gas, and a pressure monitor and a pressure controller, each of which is provided in a piping for feeding the liquid CVD material to the vaporizer.

In the above-mentioned apparatus, since the pressure in the piping is monitored and then is preferably controlled by the controller, the pressure drop in the piping is prevented. Therefore, there is not caused such a disadvantage that only solvent in the liquid CVD material vaporizes so that the material of solid state is deposited.

Moreover, according to a eleventh aspect of the present invention, there is provided an apparatus for depositing a thin film on a substrate by CVD process, which comprises, at least one material container for containing a liquid CVD material in which an organometallic complex is dissolved in a solvent, at least one material feeder for feeding the liquid CVD material at a constant flow rate, a vaporizer for vaporizing the liquid CVD material fed from the feeder by heating so as to form a CVD material gas, a reaction chamber for forming the thin film on the substrate using the CVD material gas, and a light absorbing cell for detecting concentration of the CVD material gas, wherein a sampling member of the light absorbing cell is disposed so as to face to a CVD material feeding system between the vaporizer and the reaction chamber.

In the above-mentioned apparatus, since the concentration of the CVD material gas fed from the vaporizer to the reaction chamber during the film forming step is monitored every time by the light absorbing cell (FT-IR), the composition (content ratio of the elements) of the thin film can be controlled by controlling the material feeder (flow rate controller) so that the composition of the thin film is stabilized.

In addition, according to a twelfth aspect of the present invention, there is provided a method of depositing a thin film on a substrate by CVD process, which comprises the steps of, feeding a liquid CVD material including a solution in which at least one organometallic complex is dissolved in a solvent at a constant flow rate to a vaporizer by means of a material feeder while keeping the CVD material in liquid state, the CVD material being contained in a material container, vaporizing the liquid CVD material by heating in the vaporizer so as to form a CVD material gas, and forming the thin film of metal oxide on the substrate using the CVD material gas in a reaction chamber, the thin film including at least titanium, wherein TTIP and $TiO(DPM)_2$, each of which is an organometallic complex of titanium, are used together as the organometallic complex.

In the above-mentioned method, since both of oxides derived from TTIP which has a good deposition property and derived from $TiO(DPM)_2$ which has a good covering property are simultaneously deposited, the thin film after conclusion of the film forming step can have both of a good step-coverage property and a uniformity of the quality of the thin film.

Further, according to a thirteenth aspect of the present invention, there is provided a method of depositing a thin film on a substrate by CVD process, which comprises the steps of, feeding a liquid CVD material including a solution in which at least one organometallic complex is dissolved in a solvent at a constant flow rate to a vaporizer by means of a material feeder while keeping the CVD material in liquid state, the CVD material being contained in a material container, vaporizing the liquid CVD material by heating in the vaporizer so as to form a CVD material gas, and forming the thin film of metal oxide on the substrate using the CVD material gas in a reaction chamber, the thin film including at least titanium, wherein in the thin film forming step, a BST thin film is formed by means of sputtering in an early stage of the step, secondly an annealing treatment is performed, and then the thin film is formed using $TiO(DPM)_2$ solution.

In the above-mentioned method, the BST film is formed in the early stage of the film forming step by sputtering. Then, the crystallization of the BST film is advanced by the annealing treatment. After that, the thin film of oxide derived from $TiO(DPM)_2$ solution continuously grows up on the BST film. Therefore, the CVD thin film may hold the construction of the under-laying film and further may have a high affinity against the under-laying film and a high crystallinity.

Moreover, according to a fourteenth aspect of the present invention, there is provided a method of depositing a thin film on a substrate by CVD process, which comprises the steps of, feeding a liquid CVD material contained in a material container to a vaporizer by means of a material feeder while keeping the CVD material in liquid state, vaporizing the liquid CVD material by heating the material to a high temperature in the vaporizer so as to form a CVD material gas, and in the thin film forming step, an alcohol vapor such as an ethanol vapor is blown against a surface of the substrate prior to forming the thin film.

In the above-mentioned method, since the adsorption (adhesion) of the precursor of the thin film such as BST film against the surface of the interlayer insulating film is promoted by adsorption (adhesion) of alcohol, the production of abnormal morphology on the surface of the interlayer insulating film is restrained.

BRIEF DESCRIPTION OF THE DRAWINGS

These and other objects, features and advantages of the present invention will become clear from the following description taken in conjunction with the preferred embodiments with reference to the accompanying drawings throughout which like parts are designated by like reference numerals, and in which.

DETAILED DESCRIPTION OF THE PREFERRED EMBODIMENT

Hereinafter, several preferred embodiments of the present invention will be described with reference to the accompanying drawings.

<The First Embodiment>

Hereinafter, the first embodiment of the present invention will be described in accordance with the accompanying drawings. In the first embodiment, a solution in which each of $Ba(DPM)_2$, $Sr(DPM)_2$ and/or $TiO(DPM)_2$, each of which is a solid state material, is dissolved in THF (tetrahydrofuran) is used as a liquid CVD source material, and then a thin film of $(Ba,Sr)TiO_3$ (BST) is formed by chemical vapor deposition on a substrate using $O_2$ or $N_2O$ as an oxidant gas together with the above-mentioned CVD material. Hereupon, description of the same elements described above for the prior art will be properly omitted.

Figure 1:
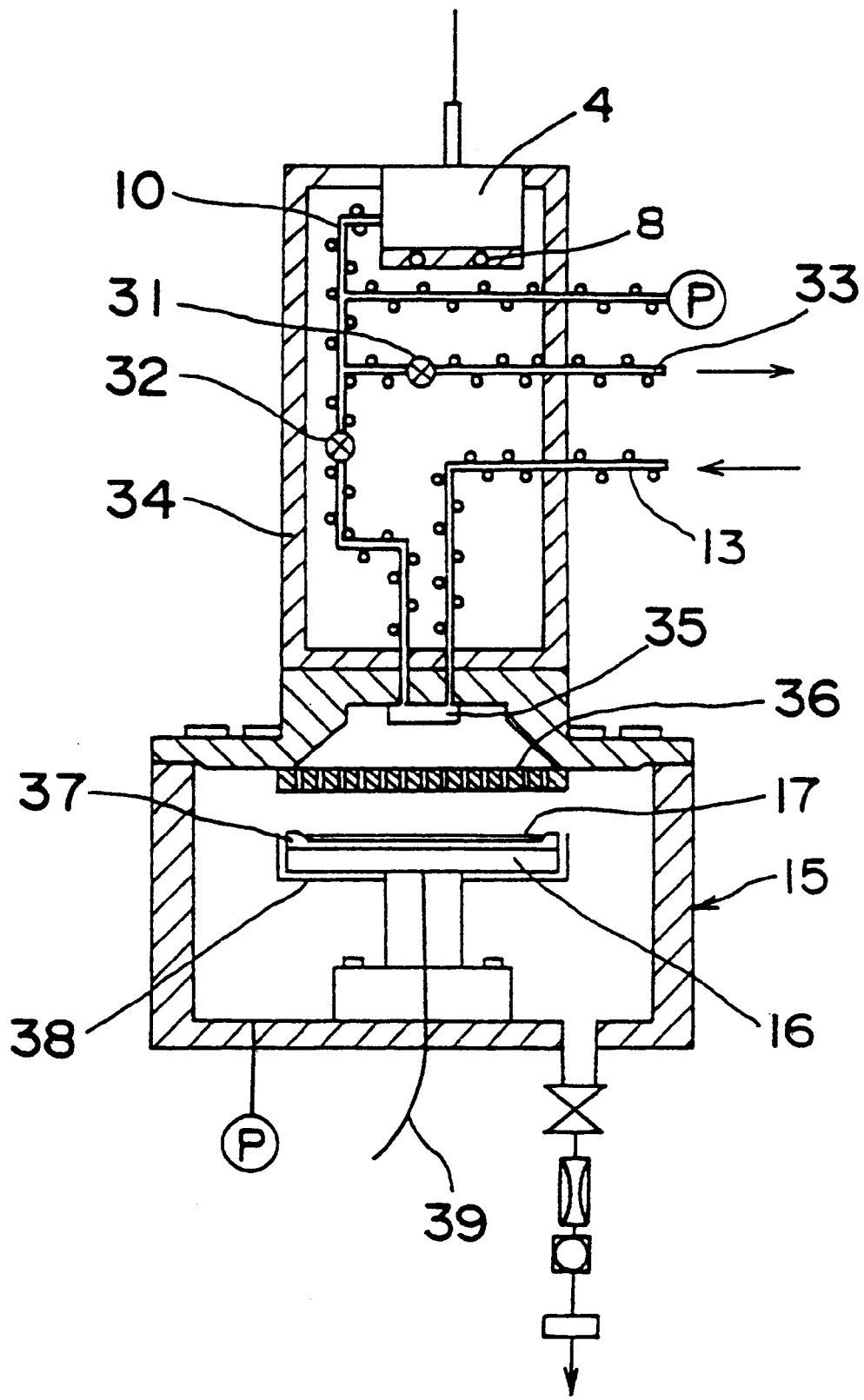
FIG. 1 is a sectional elevational schematic view of a CVD apparatus illustrating an embodiment of the present invention.

FIG. 1 is a schematic view of a CVD apparatus according to the first embodiment. As shown in FIG. 1, the CVD apparatus further comprises, in comparison with FIG. 12 which has been already described, a vent side valve 31, a reaction chamber side valve 32, a vent line 33 for a CVD material gas, a thermostatic box 34 (constant temperature box), a mixer 35, a gas nozzle 36, a susceptor 37, a reflector 38, and a thermocouple 39.

Hereinafter, operations of the CVD apparatus will be described. In the conventional CVD apparatus, as apparent from FIG. 12, the vaporizer 4 is disposed outside of but near the reaction chamber 15. On the other hand, in the first embodiment, the vaporizer 4 is disposed within the thermostatic box 34 provided on the reaction chamber 15, and also the piping 10 between the vaporizer 4 and the reaction chamber 15 is entirely accommodated within the thermostatic box 34. The piping 10 is designed so as to be heated by the ribbon heater, and then the inner wall of the thermostatic box 34 is made of a heat insulating material. The liquid CVD material, which includes $Ba(DPM)_2$, $Sr(DPM)_2$, TiO $(DPM)_2$ and THF, and the carrier gas ($N_2$ gas) are fed to the vaporizer 4 through the material feeding pipe, and then collides over a wide range of the inner wall surface of the vaporizer 4 so as to vaporize in a moment. The CVD source material gas formed by vaporizing the liquid CVD source material that is initially introduced to the vent line 33 by opening the vent side valve 31 while closing the reaction chamber side valve 32. Then, the CVD material gas is fed to the reaction chamber 15 by closing the vent side valve 31 while opening the reaction chamber side valve 32. In consequence, the CVD source material gas is mixed with the oxidant gas (for example, $O_2$, $N_2O$) in the mixer 35. Thus, using the gas mixture, there begins the formation of the thin film of BST according to CVD reaction on the surface of the substrate 17 heated by the heating stage 16.

As described above, in the CVD apparatus according to the first embodiment, since the vaporizer 4 and the piping from the vaporizer 4 to the reaction chamber 15 are entirely accommodated within the thermostatic box 34 on the reaction chamber 15, the material vaporizing system is simplified. Further, the temperature of the piping 10 between the evaporator 4 and the reaction chamber 15 may be, comparatively easily, made uniform. Moreover, since the inner wall of the thermostatic box 34 is made of a heat insulating material, the heat discharge from the ribbon heater is reduced so that the heat efficiency of the system is improved.

<The Second Embodiment>

Hereinafter, the second embodiment of the present invention will be concretely described with reference to a CVD apparatus shown in FIG. 2. Hereupon, description of the elements of the prior art which have been described above will be omitted.

Figure 2:
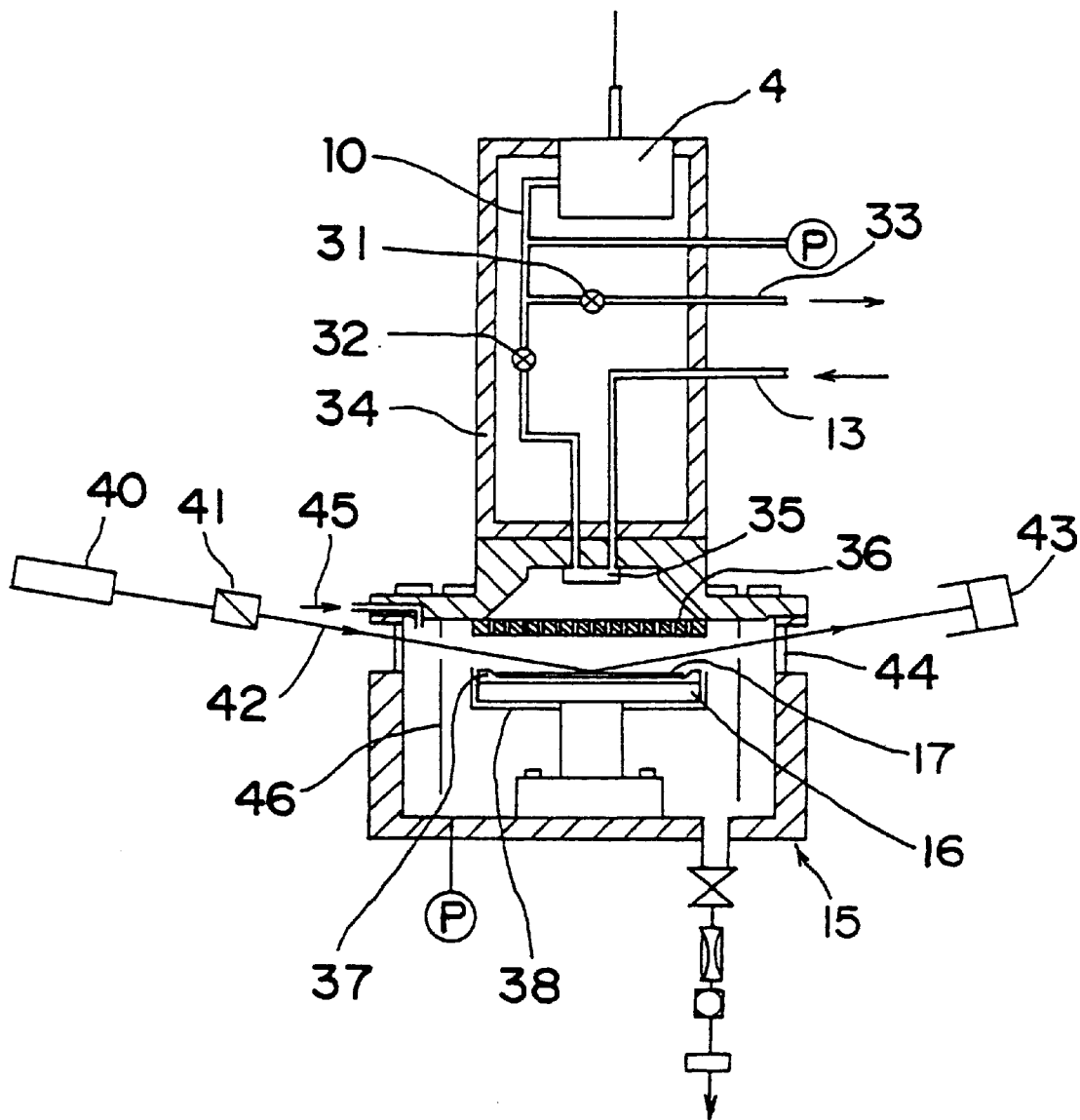
FIG. 2 is a sectional elevational schematic view of another CVD apparatus illustrating another embodiment of the present invention.

As shown in FIG. 2, the CVD apparatus further comprises an IR light source 40, a polarizer 41, an IR light detector 43, a window 44 to IR light which is made of KBr or the like and a cover 46. Hereupon, a reference numeral (an arrow) 42 shows IR light (p-polarized light), and then a reference numeral (an arrow) 45 shows $N_2$ gas for purging use.

Hereinafter, operations of the CVD apparatus will be described. Hereupon, for convenience, the plane, which is defined by the incident ray to the surface of the thin film in the of film forming process and the incident normal line of the incident ray on the thin film surface, may be referred to "incident plane", and further the light oscillating within the incident plane may be referred to "parallel polarized light the (p-wave)". In the parallel polarized light, electrical vector of the incident ray and that of the reflected ray intensify each other on the thin film surface so that there is generated a stationary oscillating electric field perpendicular to the thin film surface. Then, the stationary 15 wave acts on molecules, each of which composes the thin film, so that the light is absorbed. Hereupon, since the $N_2$ gas 45 for purging use flows through a space between the inner wall of the reaction chamber 15 and the cover 46, CVD material gas or the decomposition product of the CVD material gas is prevented from adhering to the window 44. Further, during the film forming step, the light absorption on the thin film surface is observed in situ, and to determine whether the film forming process is performed with a good repeatability or not. In addition, when reaction parameters in the film forming process are preferably controlled by estimating the reaction mechanism of the film formation, the quality of the BST thin film may be highly improved.

As described above, in the CVD apparatus according to the second embodiment, since a system which can analyze the film quality in situ by infrared absorption spectral analysis (FT-IR) during the film forming step is provided, the film forming process is performed with good repeatability. Further, since the reaction mechanism of the film formation can be estimated, the quality of the BST film can be highly improved by controlling the reaction parameters during the film forming process.

<The Third Embodiment>

Hereinafter, the third embodiment of the present invention will be described with reference to a CVD apparatus shown in FIG. 3. Hereupon, description of the elements of the prior art which have been described above will be properly omitted.

Figure 3:
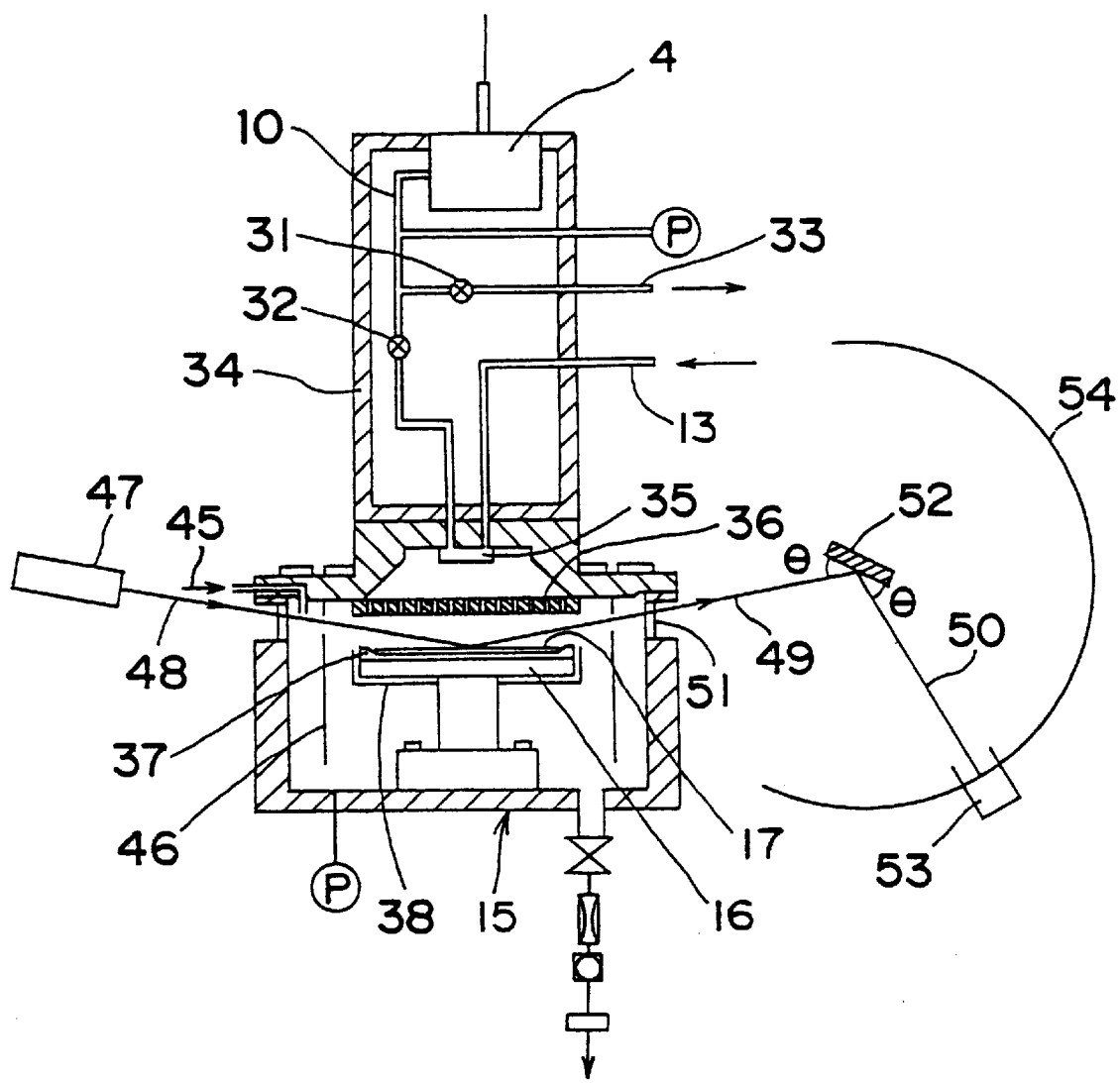
FIG. 3 is a sectional elevational schematic view of another CVD apparatus illustrating another embodiment of the present invention.

As shown in FIG. 3, the CVD apparatus further comprises an X-rays tube 47, a window 51 transmissive to X-ray which of Be or the like, an analyzing crystal 52, an X-ray detector 53 and a goniometer 54. Hereupon, a reference numeral (an arrow) 48 shows continuous X-rays, a reference numeral (an arrow) 49 shows characteristic X-rays of elements in the thin film, and then a reference numeral (an arrow) 50 shows dispersed characteristic X-rays.

Hereinafter, operations of the CVD apparatus will be described. In the CVD apparatus, when the continuous X-rays 48 generated by the X-ray tube 47 are applied onto the surface of the thin film on the way of film forming process, electrons in the K-shell and L-shell of each of atoms in the thin film are ejected. Thus, each of the atoms is brought into an excited state. Then, electrons in outer shells drop into vacancies formed in the K-shell or the L-shell, and each of the atoms in the excited state returns to the stationary state. X-rays are emitted with an energy which corresponds to the energy difference between the outer shells and the inner shells (in this case, K-shell or L-shell) each of which has a vacancy. This is the characteristic X-ray 49 of the elements in the thin film. Hereupon, the window 51 may be made of Be etc. Thus, the dispersed characteristic X-rays 50 are detected by adjusting (controlling) the angle of the analyzing crystal 52 and the angle of the X-ray detector 53 of the goniometer 54 so that the composition of the thin film is analyzed in situ during the film forming process. Hereupon, if the composition detected by the analysis in situ is different from a predetermined objective, the feeding rate of the material solution is preferably adjusted.

As described above, in the CVD apparatus according to the third embodiment, since a system which can analyze the film quality by XRF analysis in situ during the forming step is provided, the film forming process is performed with good repeatability. Further, since the reaction mechanism of the film formation can be estimated, the quality of the BST film can be highly improved by controlling the reaction parameters during film forming process.

<The Fourth Embodiment>

Hereinafter, the fourth embodiment of the present invention will be described with reference to a CVD apparatus shown in FIG. 4. Hereupon, description of the elements of the prior art which have been described above will be properly omitted.

Figure 4:
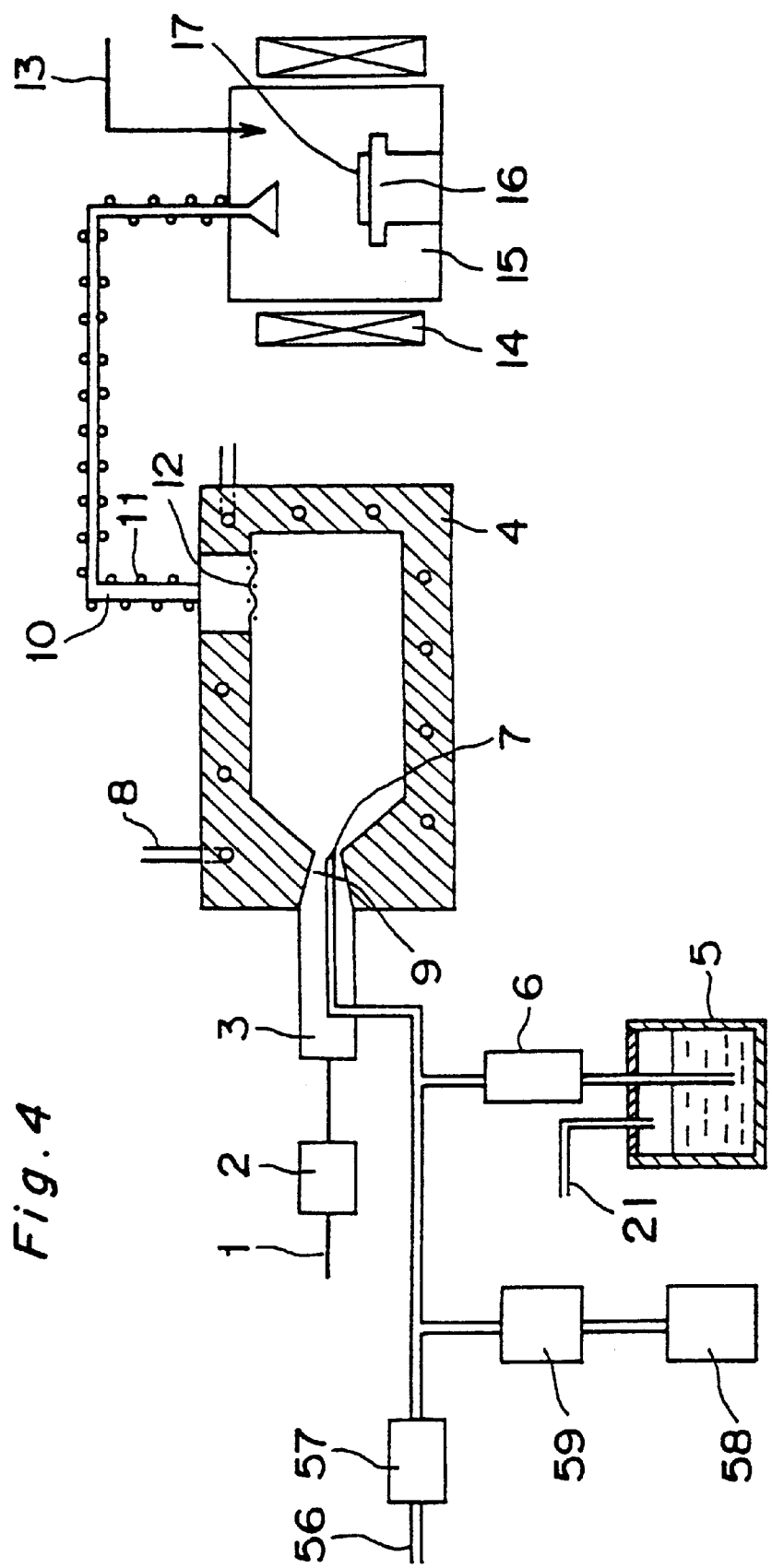
FIG. 4 is a sectional elevational schematic view of another CVD apparatus illustrating another embodiment of the present invention.

As shown in FIG. 4, the CVD apparatus further comprises a base gas inlet tube 56 for feeding inert gas, a base gas flow controller 57 for controlling flow rate of the inert gas, a solvent container 58 for containing a solvent and a solvent flow controller 59 for controlling flow rate of the solvent. The other members of the CVD apparatus are substantially as same as those of the conventional CVD apparatus shown in FIG. 12.

Hereinafter, operations of the CVD apparatus will be described. In the CVD apparatus, the inert gas is fed to the nozzle 7 through the base gas inlet tube 56, the flow rate of the inert gas being controlled by the base gas flow controller 57. On the other hand, the solvent whose flow rate is controlled by the solvent flow controller 59 is mixed with the inert gas so that a stationary base flow (steady state flow) is formed. Further, the liquid CVD material from the material container 5, whose flow rate is controlled by the material feeder 6, is combined with the base flow so that a gasliquid mixture is formed, and then the mixture is ejected into the vaporizer 4 through the end portion of the nozzle 7. Thus, the mixture is atomized so as to form a lot of liquid particles, and then the particles collide to a wide area of the inner wall of the vaporizer 4. The particles vaporize in a moment. In the above-mentioned flow system, the liquid CVD material does not stagnate in the piping to the vaporizer 4 so that choking of the piping is not caused. Further, since the solvent is mixed with the inert gas previously, the solvent in the liquid CVD material does not vaporize at the position in which the liquid CVD material is mixed with the inert gas so that the solute in the liquid CVD material is not deposited.

In the CVD apparatus according to the fourth embodiment, since the inert gas in which the solvent has been previously mixed is fed to the vaporizer 4 in a steady state and further the liquid CVD material from the material feeder 6 is combined in a steady state flow, the CVD material does not locally stagnate so that a choking is not caused in the liquid material feeding system. Therefore, vaporization of the liquid material can be stabilized over a long time.

<The Fifth Embodiment>

Hereinafter, the fifth embodiment of the present invention will be described. Hereupon, description of the same elements as the prior art which has been described above will be omitted.

Figure 5:
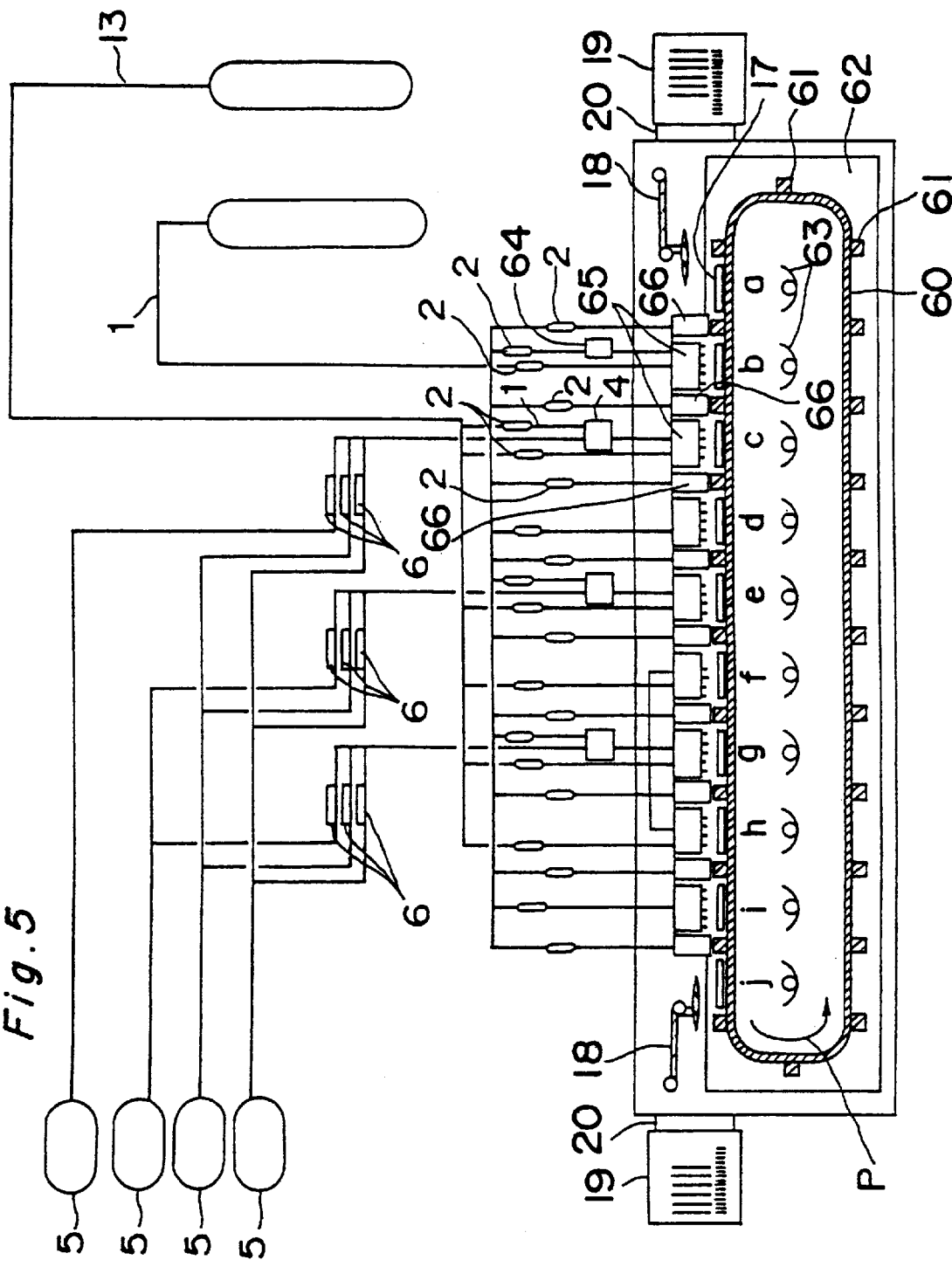
FIG. 5 is a sectional elevational schematic view of another CVD apparatus illustrating another embodiment of the present invention.
Figure 12:
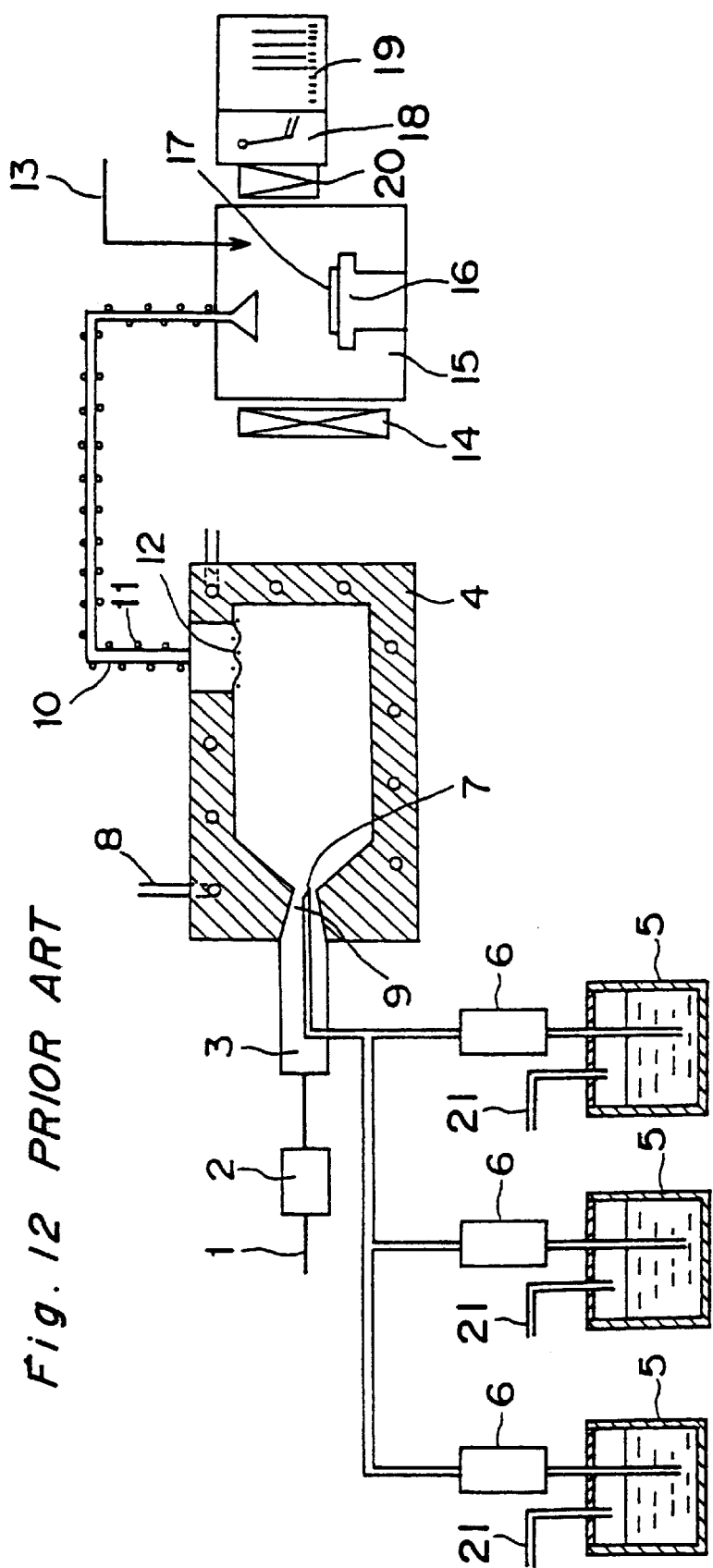
FIG. 12 is a sectional elevational schematic view of a conventional CVD apparatus.

FIG. 5 is a schematic view which of a thin film depositing apparatus for a BST thin film forming process using CVD (CVD apparatus), according to the fifth embodiment of the present invention. Hereupon, in FIG. 5, members common to those in the conventional CVD apparatus shown in FIG. 12 are affixed with same reference numerals.

As shown in FIG. 5, in the CVD apparatus according to the present invention, there are provided eight reaction chambers as indicated by "b" to "i". Hereupon, "a" and "j" indicate intake and outlet positions of the substrate 17 respectively. Further, the CVD apparatus comprises a carrier gas supply tube 1 for supplying a carrier gas such as argon and a reactive gas feeding tube 13 for feeding an oxidant such as oxygen or $N_2O$. Moreover, the CVD apparatus comprises a plurality of carrier gas flow controllers 2 such as mass flow controllers. In FIG. 5, the reference numerals of some of the carrier gas flow controllers 2 are omitted for convenience of spacing in the drawing. In addition, the CVD apparatus comprises four liquid material containers 5, each of which can contain $TiO(DPM)_2$ solution in THF, $Ba(DPM)_2$ solution in THF, $Sr(DPM)_2$ solution in THF and TTIP solution in THF respectively, each of the containers 5 containing a the solution in a volume of 100 to 3000 cc. Further, the CVD apparatus comprises a plurality of vaporizers 4, a plurality of gas heads 65 each of which mixes the CVD source material vapor and the oxidant together so as to blow the mixture against the substrate 17. In FIG. 5, the reference numerals of some of the vaporizers 4 and the gas nozzles 65 are omitted for convenience of spacing in the drawing.

Furthermore, the CVD apparatus comprises a belt conveyer type movable susceptor 60 which rotates in the direction of an arrow P so as to carry the substrates 17. Still further, the CVD apparatus comprises a plurality of spacers 61, each of which has a thickness a little larger than that of the substrate 17. Hereupon, each of the spacers 61 can face one of a plurality of partition plates 66 of the reaction chamber, each of the partition plates 66 having a gas supply hole opening downward at the lower end surface thereof. Hereupon, intervals between the spacers 61 and the partition plates 66, through which the gas diffuses, is less than or equal to 1 mm. Further, the CVD apparatus comprises a plurality of lamp heaters 63, each of which heats the substrate 17, and an ethanol vaporizer 64 for vaporizing liquid ethanol. In FIG. 5, the reference numerals of some of the spacers 61, partition plates 66 and lamp heaters 63 are omitted for convenience of spacing in the drawing. Moreover, the CVD apparatus comprises a vacuum chamber 62 whose pressure (vacuum) is as same as that in the reaction chamber, a plurality of handlers 18 (substrate handler), a plurality of gates 20 (gate shutter) and a plurality of load-unload chambers 19.

Hereupon, the movable susceptor 60 has a plurality of pans (not shown) made of quartz, each of the pans being designed to hold the substrate 17. Thus, the surface each of the pans, which is to contact to the substrate 17, has an expanded convex shape. The maximum expanding length of each of the convex is set at 10 to 100 $\mu$m. Then, the substrate 17 is pressed against the surface of the pan by a presser (not shown) so as to be fixed to the surface of the pan in a bent (distorted) state.

Hereinafter, there will be described a thin film depositing process by CVD method using the above-mentioned CVD material and the CVD apparatus.

The belt conveyer type movable susceptor 60 rotates in a counter clockwise direction (the direction of the arrow P). Thus, after each of the vaporizer 4, the CVD material gas transport piping 10 and the reaction chambers b-i has been heated to a predetermined temperature by the corresponding heaters 8,11,14 and 16, a substrate 17 in the load-unload chamber 19 is carried to the upper right end portion (position "a") of the movable susceptor 60 through the gate 20 by the handler 18. Then, the substrate 17 is carried to the reaction chamber b while being heated (maintained) at a predetermined temperature (400 to 600° C.).

In the reaction chamber b, ethanol vapor formed in the ethanol vaporizer 64 and the carrier gas are blown together against the surface of the substrate 17. The ethanol vapor is adsorbed onto the surface of a interlayer insulating film on the substrate 17 so that a transformed layer is formed. The surface of the interlayer insulating film is originally hydrophilic, and consequently it is difficult or impossible for the surface to adsord a material gas which is hydrophobic. However, when ethanol vapor is adsorbed onto the surface, the surface becomes hydrophobic so that the material gas is easily adsorbed onto the surface.

In the reaction chamber c, $Sr(DPM)_2$ and TTIP are supplied so, that there is formed an initial strontium titanate (ST) thin film having a thickness of 50 to 100 angstroms. Since the ST thin film made from TTIP is crystallized more easily on a different kind of substrate in comparison to BST thin film, there is obtained a perovskite initial film which is comparatively thin and also has a good crystallinity.

In the reaction chamber d, there is not formed any kind of thin film, but the substrate 17 is heated to a high temperature (700 to 800° C.) by the lamp heater 63 (heating lamp using infrared ray). Since the structure of the perovskite crystal of BST group is changed in a temperature range of 700 to 800° C., the crystallization of the initial ST film is promoted in this step.

In the reaction chamber e, the temperature of the substrate 17 is lowered to the film forming temperature (400 to 600° C.), and also each of $TiO(DPM)_2$ solution in THF, $Ba(DPM)_2$ solution in THF and $Sr(DPM)_2$ solution in THF is vaporized in is the vaporizer 4 so as to be fed to the reaction chamber. In consequence, there is formed a BST thin film having a thickness of 50 to 100 angstroms, in which the Ba content is larger than the Sr content. The BST thin film provides Ba to the under layer of ST during the heat treatment process in the following step, whereby the electrical properties of the under layer are improved.

In each of the reaction chambers f–h, the temperature of the substrate 17 is maintained at the film forming temperature (400 to 600° C.), while each of $TiO(DPM)_2$ solution in THF, $Ba(DPM)_2$ solution in THF and $Sr(DPM)_2$ solution in THF is vaporized in the vaporizer 4 so as to be fed to the reaction chamber. Thus, in each of the reaction chambers f–h, there is formed a BST thin film having a thickness of 50 to 100 angstroms in which Ba content is equal to Sr content so that the total thickness of the three thin films becomes 150 to 300 angstroms. When $TiO(DPM)_2$ is used as a source of Ti, it may be expected that a conformable film is formed to the side surface of the storage node.

In the last reaction chamber i, there is not formed any kind of thin film, but the substrate 17 is heated to a higher temperature (700 to 800° C.), whereby the crystallization of the deposited BST film is promoted.

Hereupon, since the substrate 17 is bent according to the bending of the surface of the pan, the grating constant of a platinum under layer (2.26 Å at 111 surface) is enlarged so as to approaches a bulk value of the BST film (2.32 Å at 111 surface, 2.86 Å at 110 surface). Therefore, the crystallization of the BST film is easily achieved.

Hereupon, when the substrate 17 is observed in detail, it may be seen that the crystallized BST thin film is deposited on the upper and side surface of the storage node and on the surface of the interlayer insulating film. The substrate 17 which is carried to the upper left end portion (position "j") of the belt conveyer type movable susceptor 60 is transferred again to the load-unload chamber 19 by the handler 18 so that the film formation is completed.

Hereupon, in each of the reaction chambers b–i, there is formed a exhaust gas flow toward a exhaust passage (not shown) which is oriented in a before-behind direction in FIG. 5 respectively so that the pressure in each of the reaction chambers b–i is uniformly maintained. Further, since the interval between each of the spacers 61 and corresponding one of the partition plates 66 is small and also $N_2$ gas is blown out from the lower surface of each of the partition plates 66 so that there is formed a $N_2$ gas flow toward the reaction chambers located on both sides thereof, the mutual movement of the material vapor between the adjacent reaction chambers is restricted.

According to the fifth embodiment, since the thin film is formed with the most suitable materials and components thereof and also under the most suitable thermal circumstances in each of the early, middle and final stages of the film forming step, the formation of the BST thin film with good electrical characteristics is achieved with efficient through put.

Hereupon, the reaction chambers b and c are provided to grow the initial film. Even if the BST film is formed by sputtering, not by CVD, and then the BST film is subjected to an annealing treatment in the reaction chamber d, a good initial film may be formed.

<The Sixth Embodiment>

Hereinafter, the sixth embodiment of the present invention will be described with reference to the accompanying drawings. Hereupon, description of the elements of the prior art which have been described above will be properly omitted.

Figure 6:
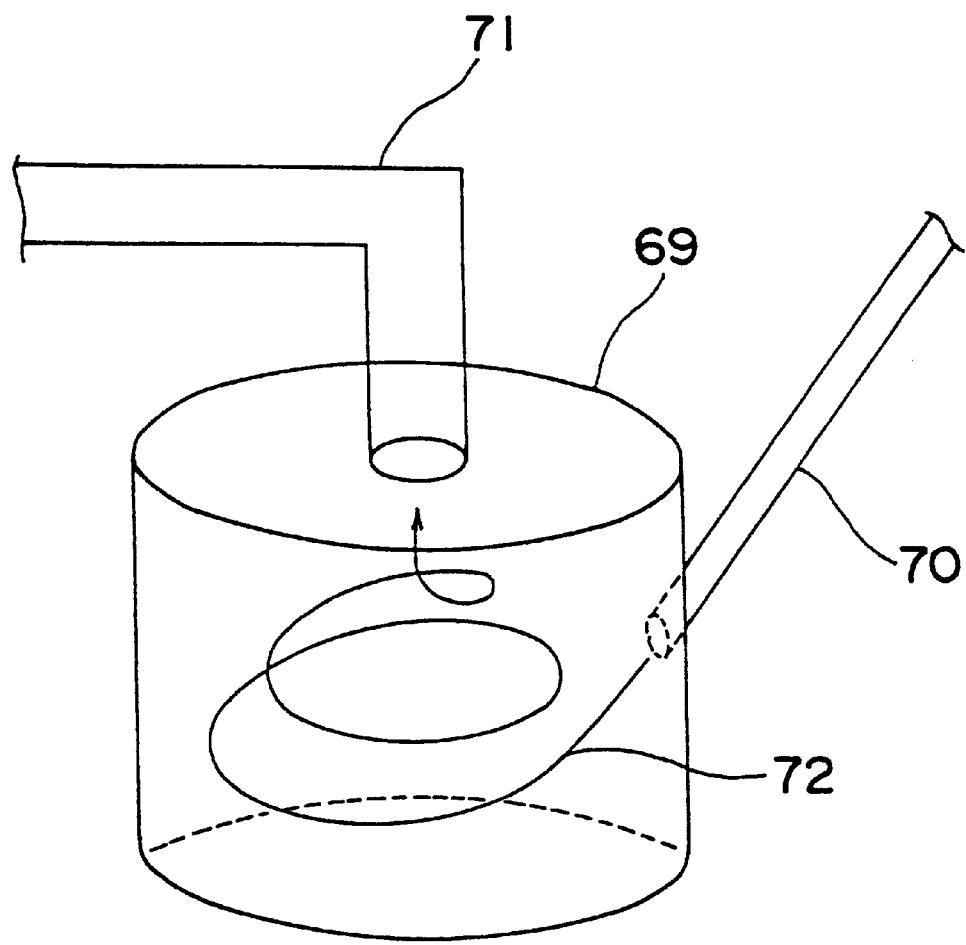
FIG. 6 is a perspective schematic view of another CVD apparatus illustrating another embodiment of the present invention.

FIG. 6 shows a rough structure of a vaporizer and some members thereabout, each of which is a component of the CVD apparatus according to the sixth embodiment. As shown in FIG. 6, the CVD apparatus further comprises a vaporizer 69 having a cylindrical shape, a nozzle 70 for blowing both of the liquid CVD source material and the carrier gas into the vaporizer 69 in the tangential direction (circumferential direction) of the cylinder, and a material gas transport pipe 71 for discharging the CVD material gas from the cylindrical vaporizer 69 in the direction of the center thereof. Hereupon, an arrow 72 (vortex line) shows a flow (swirl) of a mixture including the liquid CVD source material and the carrier gas, the mixture being vigorously blown into the vaporizer 69 through the nozzle 70.

Hereinafter, operations of the CVD apparatus will be described. In the CVD source apparatus, the liquid CVD source material which is vigorously blown into the vaporizer 69 in the tangential direction thereof through the nozzle 70 together with the inert carrier gas, is vaporized while flowing along the inner wall of the cylindrical vaporizer 69 by centrifugal force thereof. Then, the CVD material gas formed by vaporization of the liquid passes through the material gas transport pipe 71 connected to the center of the vaporizer 69, and then the gas is introduced into the reaction chamber 15. Even if there is formed dust or powder in the vaporizer 69, it adheres to the inner wall of the vaporizer 69 due to centrifugal force thereof. Therefore, coming of the dust or powder into the reaction chamber 15 through the material gas transport pipe 71 is prevented.

As described above, in the CVD apparatus according to the sixth embodiment, since the dust or powder formed in the vaporizer 69 adheres go the inner wall of the vaporizer 69, the dust or powder is hardly scattered in the vaporizer 69 so that coming of the dust or powder into the reaction chamber 15 is prevented.

<The Seventh Embodiment>

Hereinafter, the seventh embodiment of the present invention will be described with reference to the accompanying drawings. Hereupon, description of the elements of the prior art which have been described above will be properly omitted.

Figure 7:
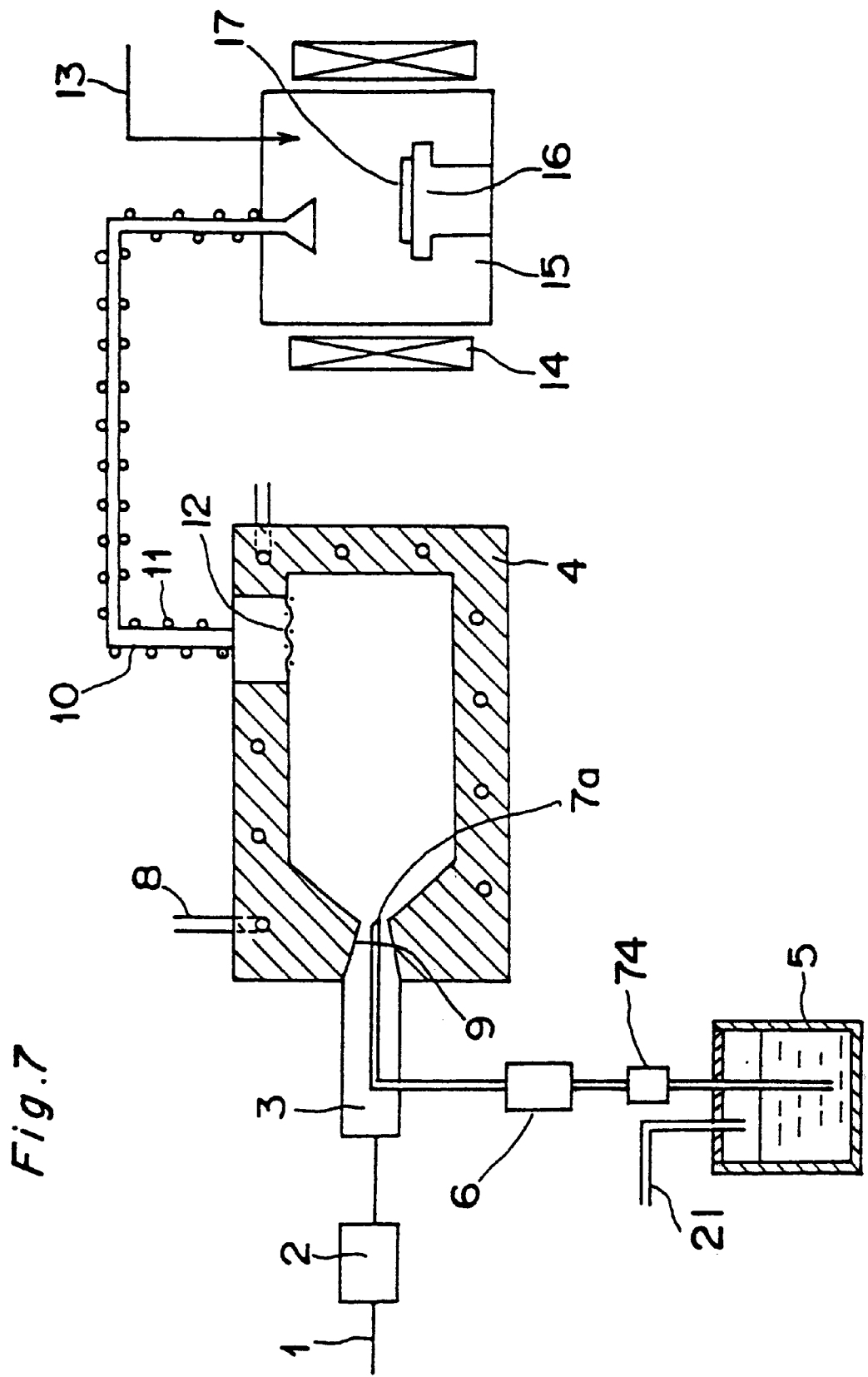
FIG. 7 is a sectional elevational schematic view of another CVD apparatus illustrating another embodiment of the present invention.

FIG. 7 shows a schematic structure of the CVD apparatus according to the seventh embodiment. As shown in FIG. 7, the CVD apparatus further comprises a pressurizing pump 74 interposed in the piping between the material containers and the material feeder 6, and a atomizer nozzle 7a for atomizing the liquid CVD material pressurized by the pressurizing pump 74. The other members of the CVD apparatus are substantially the same as those of the conventional CVD apparatus shown in FIG. 12.

Hereinafter, operation of the CVD apparatus will be described. In the CVD source apparatus, the liquid CVD material supplied from the material container 5, for example a solution in which Ba $(DPM)_2$ is dissolved in THF at a conentration of 0.1 mol/liter, is pressurized to 2 to 5 atm by the pressurizing pump 74. Then, the liquid CVD material is transferred to the atomizer nozzle 7a by the material feeder 6, and then it is atomized by the atomizer nozzle 7a so as to become a CVD source material mist. The CVD source material mist is heated and vaporized in the vaporizer 4 easily so as to be introduced to the reaction chamber 15 without forming residue.

As described above, in the CVD apparatus according to the seventh embodiment, since the liquid CVD material is atomized prior to its vaporization in the vaporizer 4, formation of residue in the vaporizer 4 is prevented or reduced.

<The Eighth Embodiment>

Hereinafter, the eighth embodiment of the present invention will be described with reference to the accompanying drawings. Hereupon, description of the elements of the prior art which has been described above will be omitted.

Figure 8:
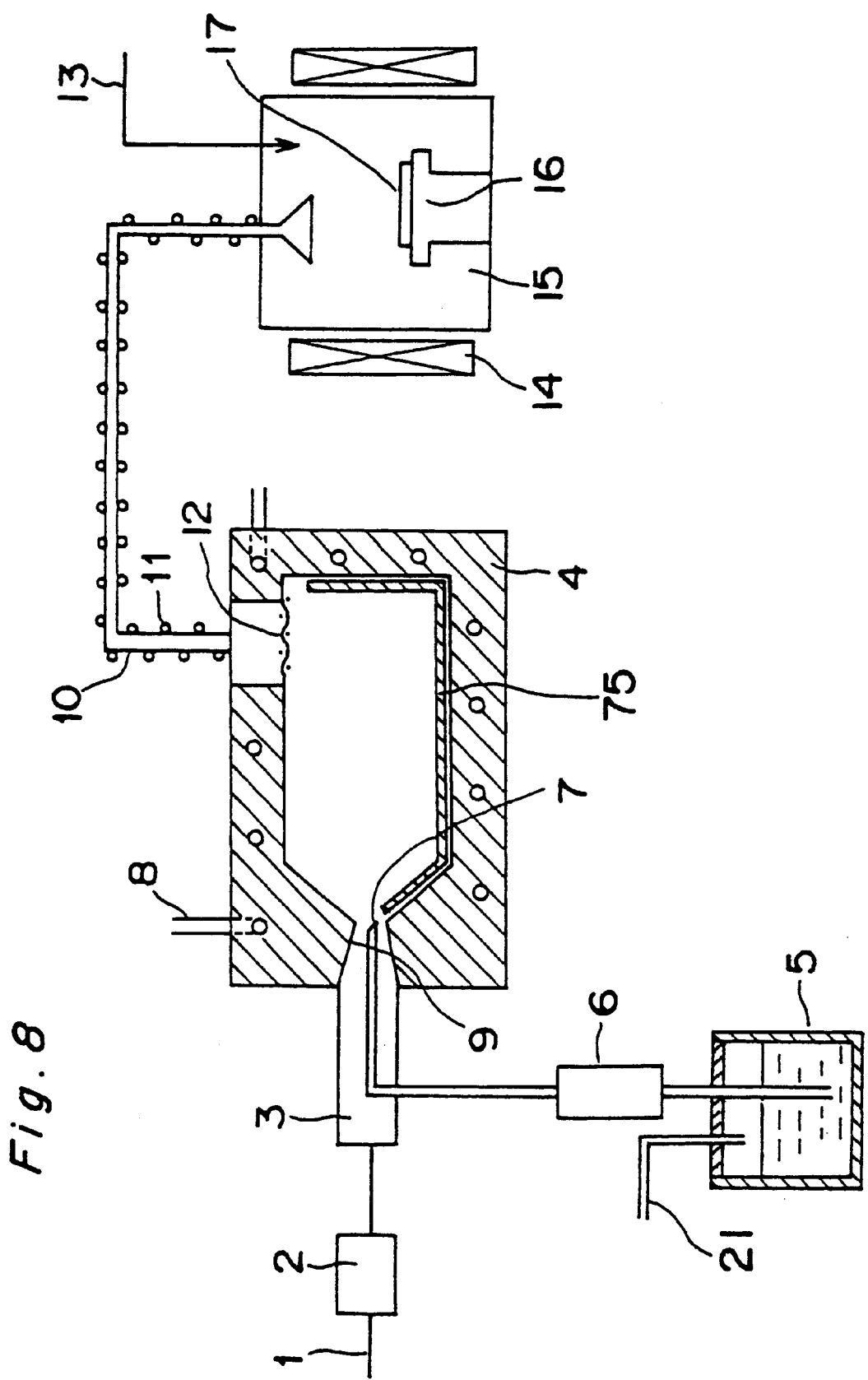
FIG. 8 is a sectional elevational schematic view of another CVD apparatus illustrating another embodiment of the present invention.

FIG. 8 shows a rough structure of the CVD apparatus according to the eighth embodiment. As shown in FIG. 8, the CVD apparatus further comprises a replaceable inner wall plate 75 provided on the inner wall surface of the vaporizer 4. The other members of the CVD apparatus are substantially the same as those of the conventional CVD apparatus shown in FIG. 12.

Hereinafter, operation of the CVD apparatus will be described. In the CVD apparatus, after the film forming process has been completed, an upper portion of the vaporizer 4 is detached, and then the inner wall plate 75 is replaced. In consequence, adhesive residue of the material in the vaporizer 4 may be easily removed.

As described above, in the CVD apparatus according to the eighth embodiment, since the inside portion of the vaporizer 4 can be easily cleaned by replacing the inner wall plate 75 after the film forming process, time required for maintenance is reduced so that the through put is improved.

<The Ninth Embodiments>

Hereinafter, the ninth embodiment of the present invention will be described with reference the accompanying drawings. Hereupon, description of the elements of the prior art which has been described above will be properly omitted.

Figure 9:
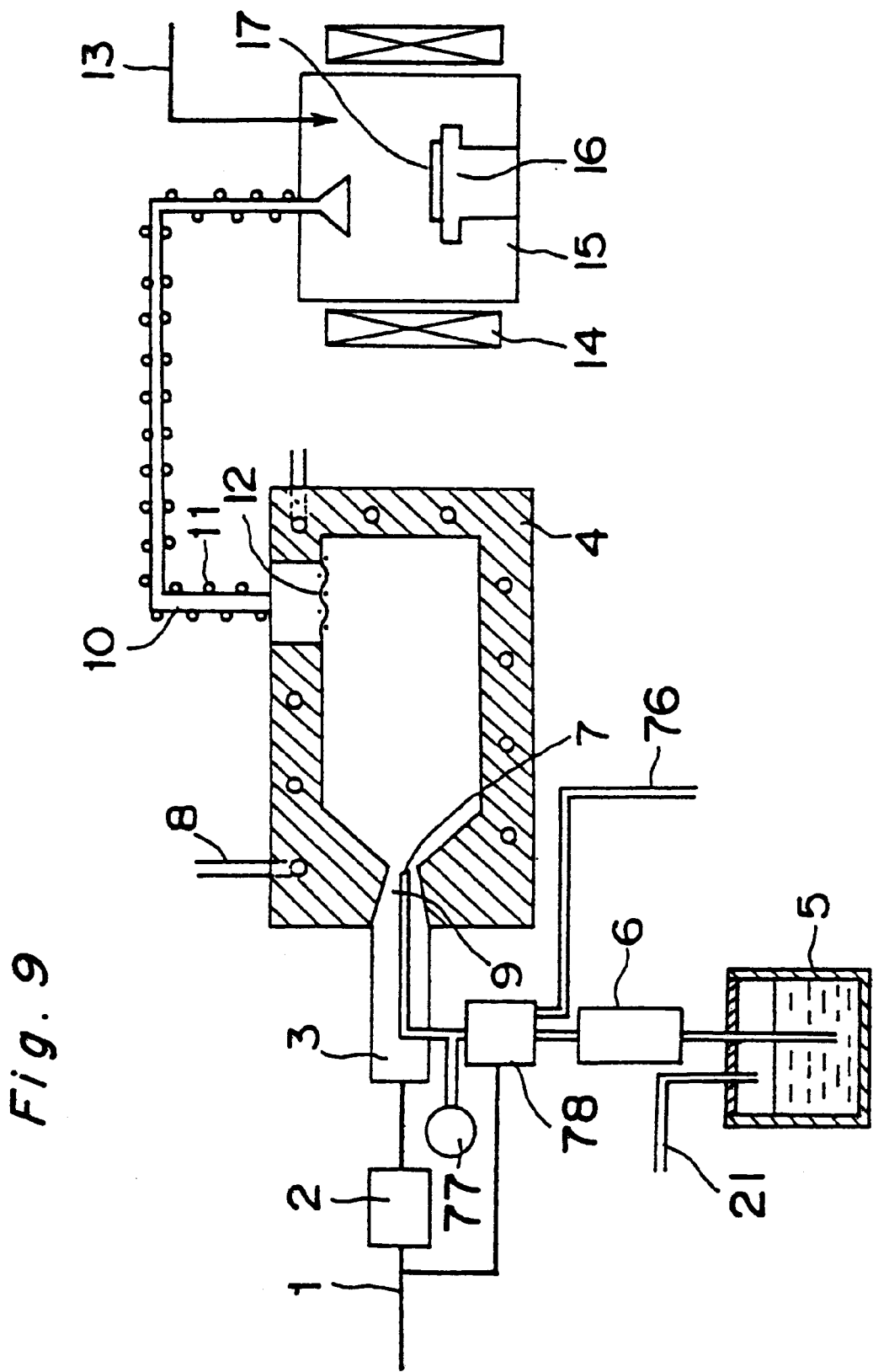
FIG. 9 is a sectional elevational schematic view of another CVD apparatus illustrating another embodiment of the present invention.

FIG. 9 shows a rough structure of the CVD apparatus according to the ninth embodiment. As shown in FIG. 9, the CVD apparatus further comprises a pressure monitor 77 for monitoring CVD source material pressure, a pressure controller 78 associated with the pressure monitor 77 for controlling the CVD source material pressure, and a solvent feeding pipe 76 for feeding a solvent to the pressure controller 78. Hereupon, the pressure controller 78, for example, controls the CVD source material pressure by changing inert gas flow rate or solvent flow rate thereto. The other members of the CVD apparatus are substantially as same as those of the conventional CVD apparatus shown in FIG. 12.

Hereinafter, operations of the CVD apparatus will be described. In the CVD apparatus, after the vaporizer 4 has been heated to a predetermined temperature of as much as 250° C. by the heater 8, the inert carrier gas for material dilution use is fed to the vicinity of the nozzle 7 at a constant flow rate by the carrier gas flow controller 2, and then the carrier gas is ejected from the vicinity of the nozzle 7. Hereupon, when the liquid CVD source material is fed from the material feeder 6 (liquid flow controller) to the vaporizer 4 at a constant flow rate, the CVD source material is ejected from the apex end portion of the nozzle 7, and then immediately the CVD source material is roughly atomized by the dilution gas flowing at high speed around the CVD source material. In consequence, the atomized CVD source material collides to the inner wall of the vaporizer 4 over a wide range so as to be vaporized in a moment. The pressure controller 78 automatically controls the CVD material pressure in response with the output of the pressure monitor 77 by changing solvent feeding rate in such a manner that pressure in the piping is held at a constant value (over atmospheric pressure). In consequence, preceding vaporization of the solvent in the CVD source material is prevented so that a stable vaporization of the CVD source material can be achieved without causing choking of the piping and the nozzle 7 for a long time.

In the CVD apparatus according to the ninth embodiment, since the pressure monitor 77 and the pressure controller 78 are provided in the piping for feeding the liquid CVD source material into the vaporizer 4, pressure drop in the piping is not caused so that only solvent in the liquid CVD source material vaporizes. Therefore, there is not caused any choking of the piping so that stable operation can be achieved for a long time.

<The Tenth Embodiment>

Hereinafter, the tenth embodiment of the present invention will be described in accordance with the accompanying drawings. In the tenth embodiment, a solution in which each of $Ba(DPM)_2$, $Sr(DPM)_2$ and/or $TiO(DPM)_2$, each of which is a solid state material, is dissolved in THF (tetrahydrofuran) is used as a liquid CVD source material, and then a thin film of BST is formed on a substrate. Hereupon, description of the elements of the prior art which has been described above will be properly omitted.

Figure 10:
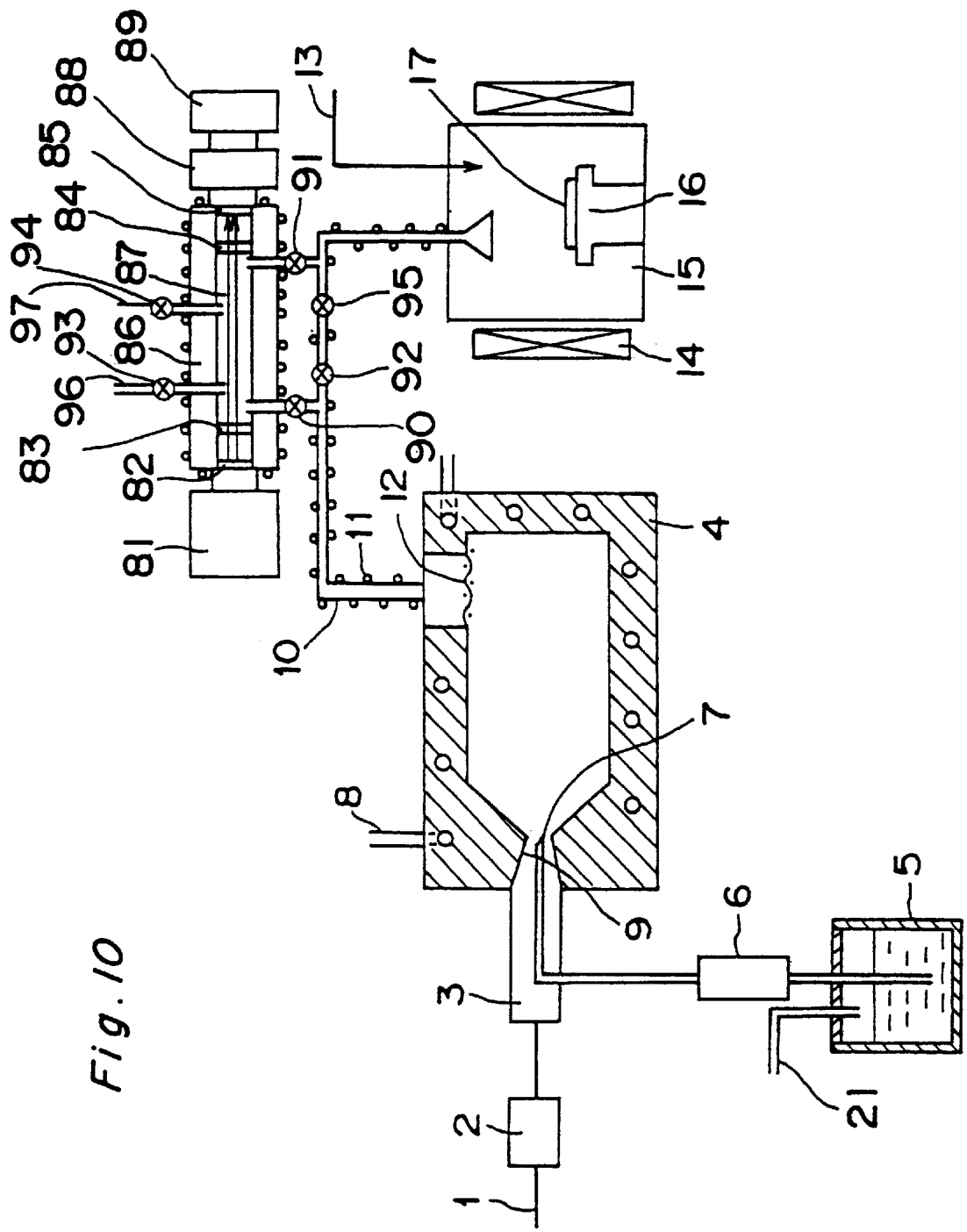
FIG. 10 is a sectional elevational schematic view of another CVD apparatus illustrating another embodiment of the present invention.

FIG. 10 shows a rough construction of the CVD apparatus according to the tenth embodiment. As shown in FIG. 10, the CVD apparatus further comprises a infrared absorption spectral analysis (FT-IR) apparatus. Hereupon the infrared absorption spectral apparatus includes a light source 81 for emitting infrared light, a plurality of windows 82–85 made of KBr, an infrared ray absorbing tube 86, a spectroscope 88, a detector for detecting infrared light 89 from the spectroscope 88, a plurality of shutter valves 90–95, a $N_2$ gas supply tube 96 for supplying $N_2$ gas into the infrared absorbing tube 86, and a gas discharge tube 97 for evacuating the infrared absorbing tube 86. Hereat, arrows 87 show infrared rays emitted from the light source 81.

Hereinafter, operation of the CVD apparatus will be described. In the operation of the CVD apparatus, shutter valves 90 and 91 are closed at first. Then, the shutter valve 93 is closed, while the shutter valve 94 is opened. The infrared ray absorbing tube 86 is evacuated through the gas discharge tube 97. Namely, gas in the infrared absorbing tube 86 is discharged through the gas discharge tube 97. Thus, after the gas in the infrared absorbing tube 86 has been sufficiently discharged, the shutter valve 94 is closed. Then, the shutter valves 92 and 95 are closed, while the shutter valves 30 and 31 are opened. In consequence, the CVD source gas formed in the vaporizer 4 by vaporization is introduced into the reaction chamber 15 through the infrared absorbing tube 86. The infrared light emitted from the light source 81 of the FT-IR apparatus passes through the CVD source material in the infrared ray absorbing tube 86 so as to be detected by the spectroscope 88 and the detector 89.

Figure 11A:
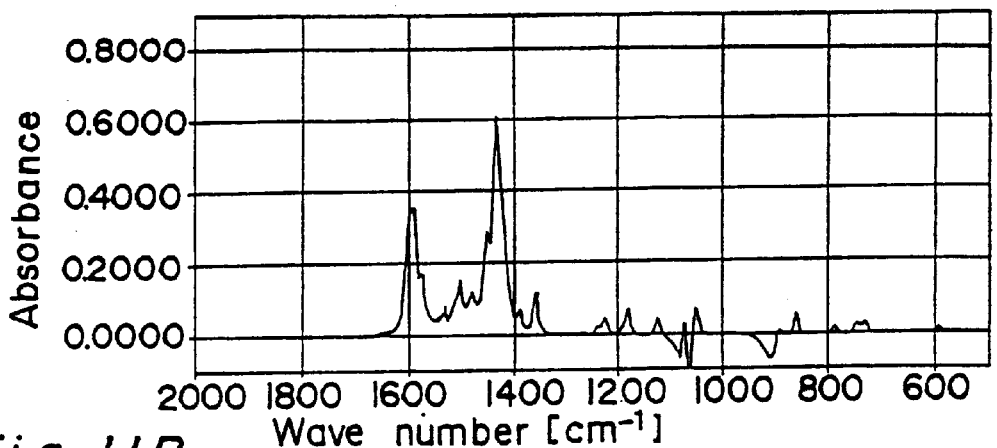
FIGS. 11A to 11C are graphics, each of which shows a measurement result of infrared absorption spectroscopy for a CVD material.
Figure 11B:
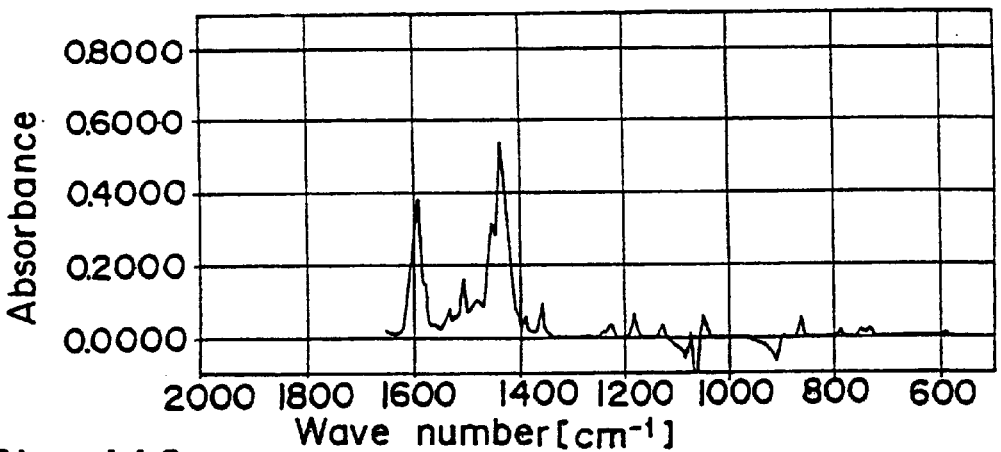
Figure 11C:
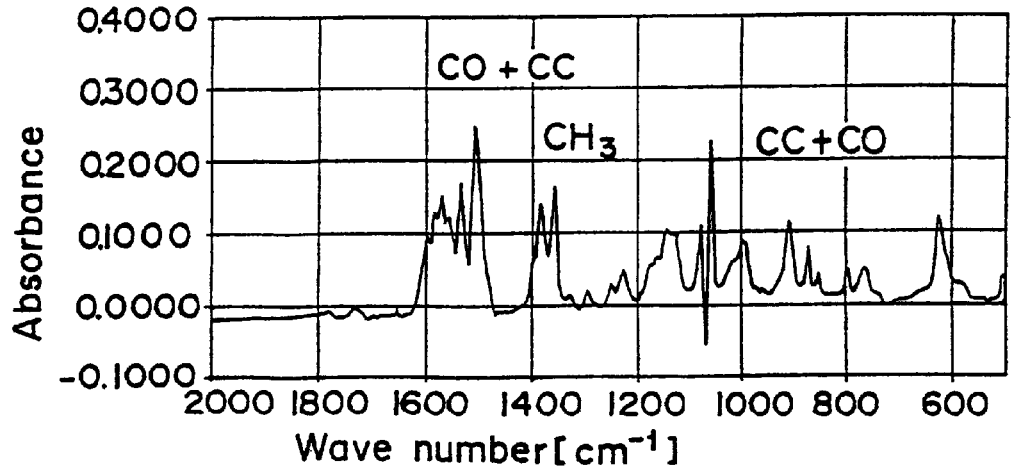

In each of FIGS. 11A to 11C, there is shown an infrared ray absorption spectrum example of each of the solutions in which $Ba(DPM)_2$, $Sr(DPM)_2$ or $TiO(DPM)_2$ is dissolved in THF, respectively. In FIGS. 11A to 11C, the molar concentration of each of $Ba(DPM)_2$ and $Sr(DPM)_2$ can be evaluated according to the absorption peak value at 1450 $cm^{-1}$. On the other hand, the molar concentration of $TiO(DPM)_2$ can be evaluated according to the absorption peak value at 1520 $cm^{-1}$ or 650 $cm^{-1}$. Further, the feeding rate of each of $Ba(DPM)_2$, $Sr(DPM)_2$ and $TiO(DPM)_2$ can be evaluated by taking account of flow rate of the carrier gas $N_2$. In accordance with the concentration of each of Ba, Sr and Ti evaluated as above, the mass flow controller of the material feeder 6 is controlled so that an objective CVD source material flow rate is determined. Hereupon, the infrared absorbing tube 86 is heated so as to be maintained at the same temperature as the material gas transport piping 10. Further, in order to prevent the windows 82 and 85 of KBr from becoming dim due to adhesion of residue, the further windows 83 and 84 of KBr are provided inside the windows 82 and 85. Hereupon, since the temperature of the inner windows 83 and 84 of KBr is higher than those of the outer windows 82 and 85 of KBr, the CVD source material gas does not condense thereon. When the measurement has been completed, the shutter valve 94 is opened so that the gas in the infrared absorbing tube 86 is sufficiently discharged by a vacuum pump. Then, the shutter valve 94 is closed, while the shutter valve 93 is opened. In consequence $N_2$ gas is introduced into the infrared absorbing tube 86. Hereupon, during the ordinary film forming process, the shutter valves 90 and 91 are closed, while the shutter valves 92 and 95 are opened so that the film forming process is performed in accordance with the same procedure as that of the conventional technique.

As described above, in the CVD apparatus according to the tenth embodiment, since the infrared absorbing tube 86 is provided between the vaporizer 4 and the reaction chamber 15, the concentration of the component of the CVD source material fed to the reaction chamber 15 during the film formation process can be monitored by infrared absorption spectral analysis. In consequence, the mutual ratio (composition) of Ba, Sr and Ti in the BST thin film is stabilized.

<The Eleventh Embodiment>

Hereinafter, a CVD process according to the eleventh embodiment of the present invention will be described with reference to FIG. 12. Hereupon, description of the elements of the prior art which have been described above will be properly omitted.

In the eleventh embodiment, the first and second of the three material containers 5 contain a solution in which $Sr(DPM)_2$ is dissolved in THF and a solution in which $TiO(DPM)_2$ is dissolved in THF, respectively. Thus, the third material container 5 contains nothing (or the third container does not exist). Further, in the eleventh embodiment, the reactive gas supply tube 13 supplies oxidant and TTIP gas is formed by bubbling operation. Moreover, the substrate 17 is a substrate for a super LSI, which has a step-topography of a size submicron to 1 micron height difference on its surface. The other matters are substantially as same as those of the conventional CVD process.

Hereinafter, operation flow of the CVD process will be described. Namely, after the vaporizer 4 has been heated by the heater 8 so as to reach a predetermined temperature as high as 250° C., inert carrier gas for dilution whose flow rate is controlled at a constant value by the carrier gas flow control device 2, is ejected into the vaporizer 4 through the vicinity of the nozzle 7. Hereupon, when each of the solution of $Sr(DPM)_2$ in THF and the solution of $TiO(DPM)_2$ in THF is fed from each of the two material feeders 6 to the vaporizer side at a constant flow rate, each of the CVD source materials is ejected from the end portion of the nozzle 7 to the vaporizer 4. Each of the CVD source materials is roughly atomized by the surrounding carrier gas flowing at high speed, and then the atomized CVD source material particles collide with a wide range of the inner wall of the vaporizer 4 so as to vaporize in a moment. Each of the CVD source materials which has been vaporized is transferred to the reaction chamber 15 through the material gas transport pipe 10. On the other hand, TTIP is vaporized by means of bubbling using inert gas such as $N_2$ so as to be introduced into the reaction chamber 15 through the reactive gas supply tube 13 together with oxidant gas (for example, $O_2$ or $N_2O$). The gas mixture, which is introduced into the reaction chamber 15 maintained at constant pressure, is blown against the surface of the substrate 17 heated by the substrate heating equipment 16 so that the $SrTiO_3$ film is formed on the surface of the substrate 17 according to the CVD reaction. Since both components of TTIP which has a good deposition property and $TiO(DPM)_2$ which has a good covering property interact with each other, the $SrTiO_3$ film formed by the film forming process has both a good step-shape portion covering property (step coverage) and uniformity of film quality. Hereupon, when only $TiO(DPM)_2$ is used, the structure of the thin film will become extremely nonuniform. Further, when the temperature is 450 to 500° C., the film quality will be improved remarkably. Hereupon, though TTIP is vaporized by bubbling this embodiment, TTIP may be vaporized by a vaporization operation that is the same as that of $TiO(DPM)_2$. Further, though the embodiment has been described as to the case of forming an $SrTiO_3$ film as an example, the same effects as described above are achieved in forming a solid solution film or metal oxide film having another perovskite structure including Ti, for example $PbTiO_3$, $Pb(Zr,Ti)O_3$, $BaTiO_3$, $(Ba,Sr)TiO_3$ and so on.

In the process according to the eleventh embodiment, since TTIP which has a good deposition property and $TiO(DPM)_2$ which has a good covering property are used together as organotitanium complexes, oxides in accordance with the both components are simultaneously deposited, and the thin film after conclusion of the film forming step can have both of a good step-coverage property and a uniformity of the quality of the thin film.

Although the present invention has been described in terms of preferred embodiments, it will be apparent to those of skill in the art that numerous variations and modifications may be made without departing from the true spirit and scope thereof, as set forth in the following claims.

What is claimed is:

1. An apparatus for depositing a thin film on a substrate by chemical vapor deposition (CVD) comprising:
    material containing means for containing a liquid CVD source material;
    material feeding means for feeding the liquid CVD source material from said material containing means to a vaporizer while keeping the CVD source material liquid;
    a vaporizer for vaporizing the liquid CVD source material fed from said material feeding means by heating the liquid CVD source material to a high temperature to form a CVD source material gas;
    a reaction chamber connected to said vaporizer by a pipe for forming a thin film on a substrate using the CVD source material gas; and
    a thermostatic box surrounding said reaction chamber, wherein both of said vaporizer and piping connecting said vaporizer to said reaction chamber are located within said thermostatic box.

2. The apparatus recited in claim 1, further comprising:
    a window of KBr in said reaction chamber, and means for blowing a high temperature gas against said window inside said reaction chamber; and
    film quality analyzing means for analyzing quality of a thin film growing in said reaction chamber using infrared absorption spectroscopy (FT-IR) by applying infrared light from outside of said reaction chamber to the thin film in said reaction chamber through said window of KBr.

3. The apparatus recited in claim 1, further comprising:

a window of Be in said reaction chamber, and means for blowing a high temperature gas against said window inside said reaction chamber; and film quality analyzing means for analyzing quality of a thin film growing in said reaction chamber using X-ray fluorescence analysis (XRF) by applying X-ray radiation from outside of said reaction chamber to the thin film in said reaction chamber through said window of Be.

* * * * *